United States Patent
Yamazaki et al.

(10) Patent No.: US 7,242,449 B1
(45) Date of Patent: Jul. 10, 2007

(54) SEMICONDUCTOR DEVICE AND INTEGRAL IMAGE RECOGNITION/DISPLAY APPARATUS

(75) Inventors: Shunpei Yamazaki, Tokyo (JP); Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/619,479

(22) Filed: Jul. 19, 2000

(30) Foreign Application Priority Data

Jul. 23, 1999 (JP) ................................. 11-210004

(51) Int. Cl.
G02F 1/133 (2006.01)

(52) U.S. Cl. ..................................... 349/116

(58) Field of Classification Search ................. 349/12, 349/24, 25, 42, 116; 348/349, 302, 311; 257/290–292, 431–435; 250/208.1, 214 R, 250/214 LA
See application file for complete search history.

(56) References Cited

U.S. PATENT DOCUMENTS

| | | | | |
|---|---|---|---|---|
| 5,424,244 A | * | 6/1995 | Zhang et al. | 438/301 |
| 5,585,817 A | * | 12/1996 | Itoh et al. | 345/104 |
| 5,643,826 A | | 7/1997 | Ohtani et al. | 437/88 |
| 5,812,109 A | * | 9/1998 | Kaifu et al. | 345/104 |
| 5,923,962 A | | 7/1999 | Ohtani et al. | 438/150 |
| 6,236,063 B1 | * | 5/2001 | Yamazaki et al. | 257/59 |
| 6,243,155 B1 | * | 6/2001 | Zhang et al. | 349/199 |
| 6,255,705 B1 | * | 7/2001 | Zhang et al. | 257/412 |
| 6,462,806 B2 | * | 10/2002 | Zhang et al. | 349/199 |
| 6,496,240 B1 | * | 12/2002 | Zhang et al. | 349/116 |
| 6,583,439 B2 | | 6/2003 | Yamazaki et al. | |
| 6,655,767 B2 | * | 12/2003 | Zhang et al. | 349/138 |
| 6,680,764 B2 | * | 1/2004 | Zhang et al. | 349/116 |
| 6,864,950 B2 | * | 3/2005 | Zhang et al. | 349/199 |
| 6,937,306 B2 | * | 8/2005 | Zhang et al. | 349/116 |
| 2003/0201450 A1 | | 10/2003 | Yamazaki et al. | |
| 2004/0217357 A1 | * | 11/2004 | Zhang et al. | 257/72 |
| 2005/0202609 A1 | | 9/2005 | Zhang et al. | |
| 2005/0206830 A1 | * | 9/2005 | Zhang et al. | 349/158 |

FOREIGN PATENT DOCUMENTS

JP 7-130652 5/1995

OTHER PUBLICATIONS

Y. Narutaki et al., *Development of a Novel-TFT-LCD With Excellent Legibility Under Any Intensity of Ambient Light*, Euro Display '99, The 19th International Display Research Conference, Late-News Papers, pp. 121-125, Sep. 6-9, 1999, Berlin, Germany.

* cited by examiner

Primary Examiner—David Nelms
Assistant Examiner—T L Rude
(74) Attorney, Agent, or Firm—Eric J. Robinson; Robinson Intellectual Property Law Office, P.C.

(57) ABSTRACT

A novel integral image recognition/display apparatus includes a pixel matrix, an image sensor and peripheral driving circuits for driving them, has both image recognition function and display function, and is constituted into an "intelligent" configuration. This display apparatus includes a plurality of pixel portions each having an active device and arranged in matrix, an active matrix substrate using an electrode for the pixel portion and a plurality of sensor portions arranged in matrix on the active matrix substrate, wherein the sensor portion has a photoelectric conversion device, and reads information by utilizing the rays of light transmitting through the light-transmitting material when an external image is read.

14 Claims, 14 Drawing Sheets

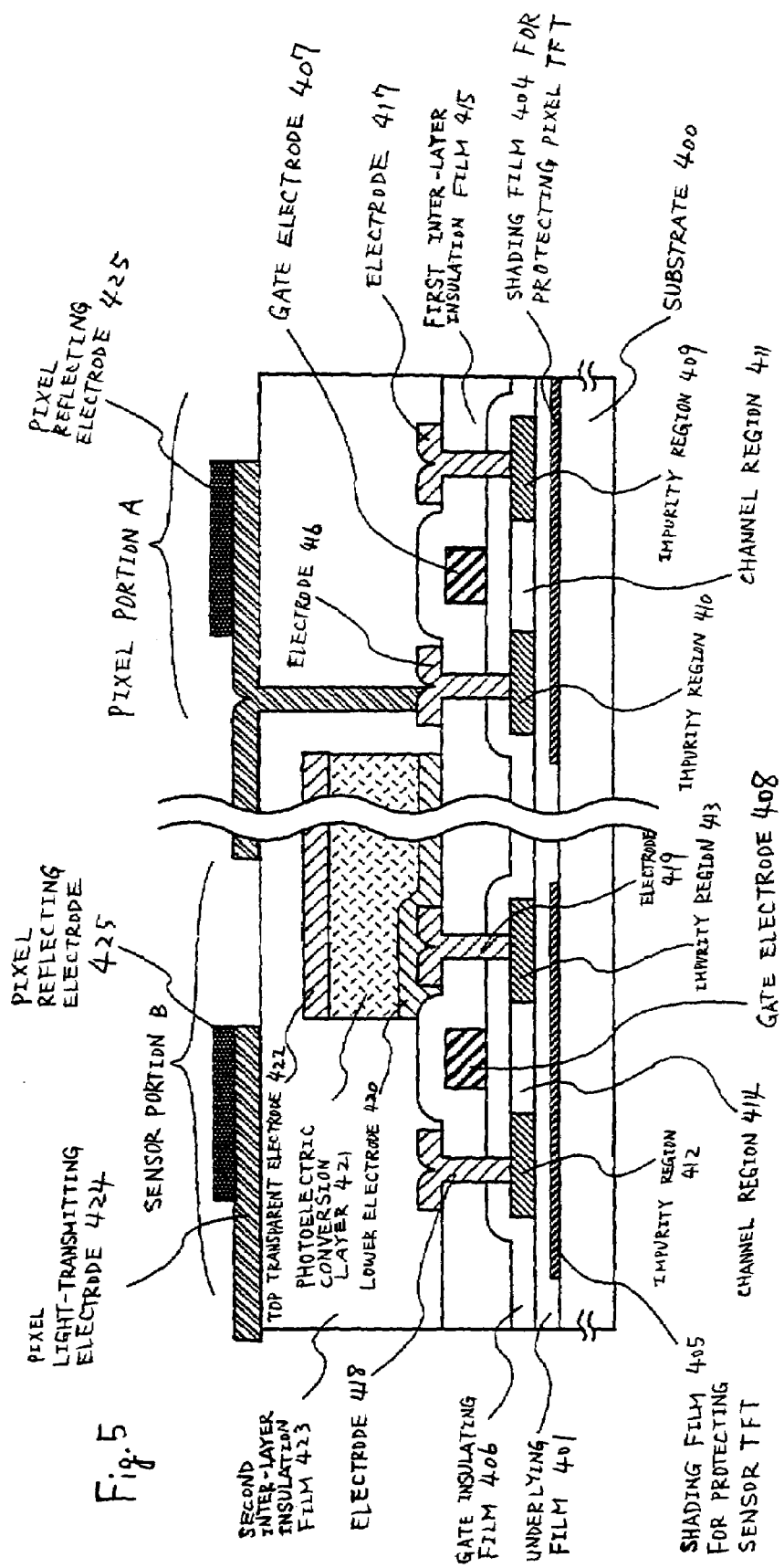

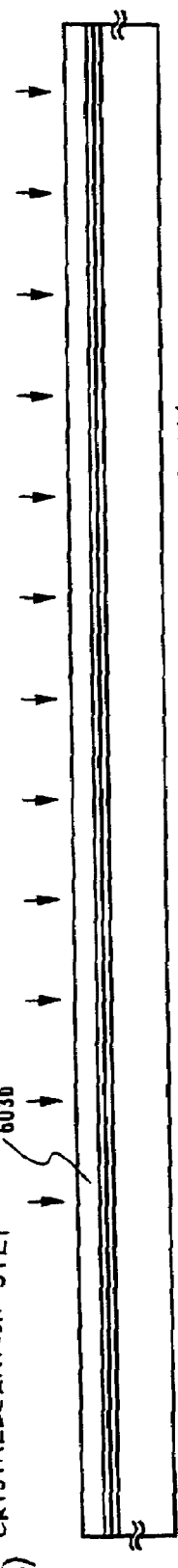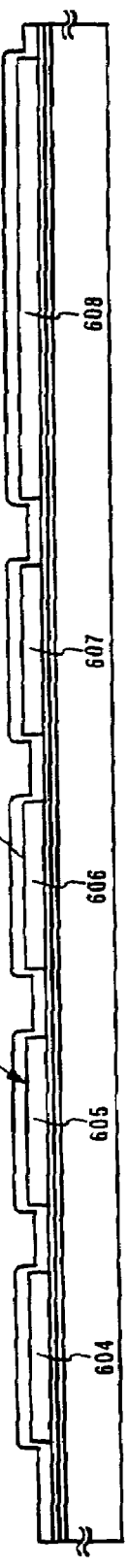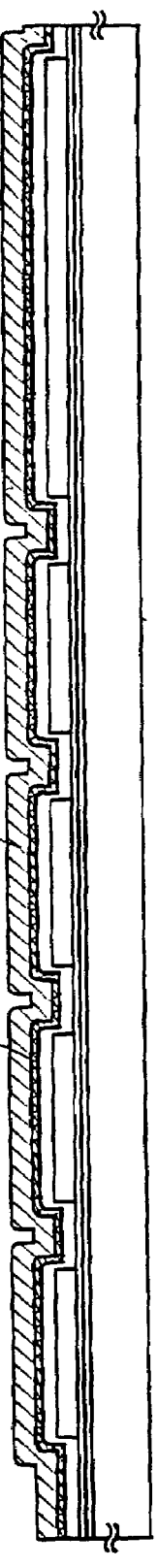
Fig. 8(A) FORMATION OF UNDERLYING FILM / AMORPHOUS SEMICONDUCTOR FILM
Fig. 8(B) CRYSTALLIZATION STEP
Fig. 8(C) FORMATION OF ISLAND-LIKE SEMICONDUCTOR LAYER / GATE INSULATING FILM
Fig. 8(D) FORMATION OF HEAT-RESISTANT CONDUCTOR LAYER

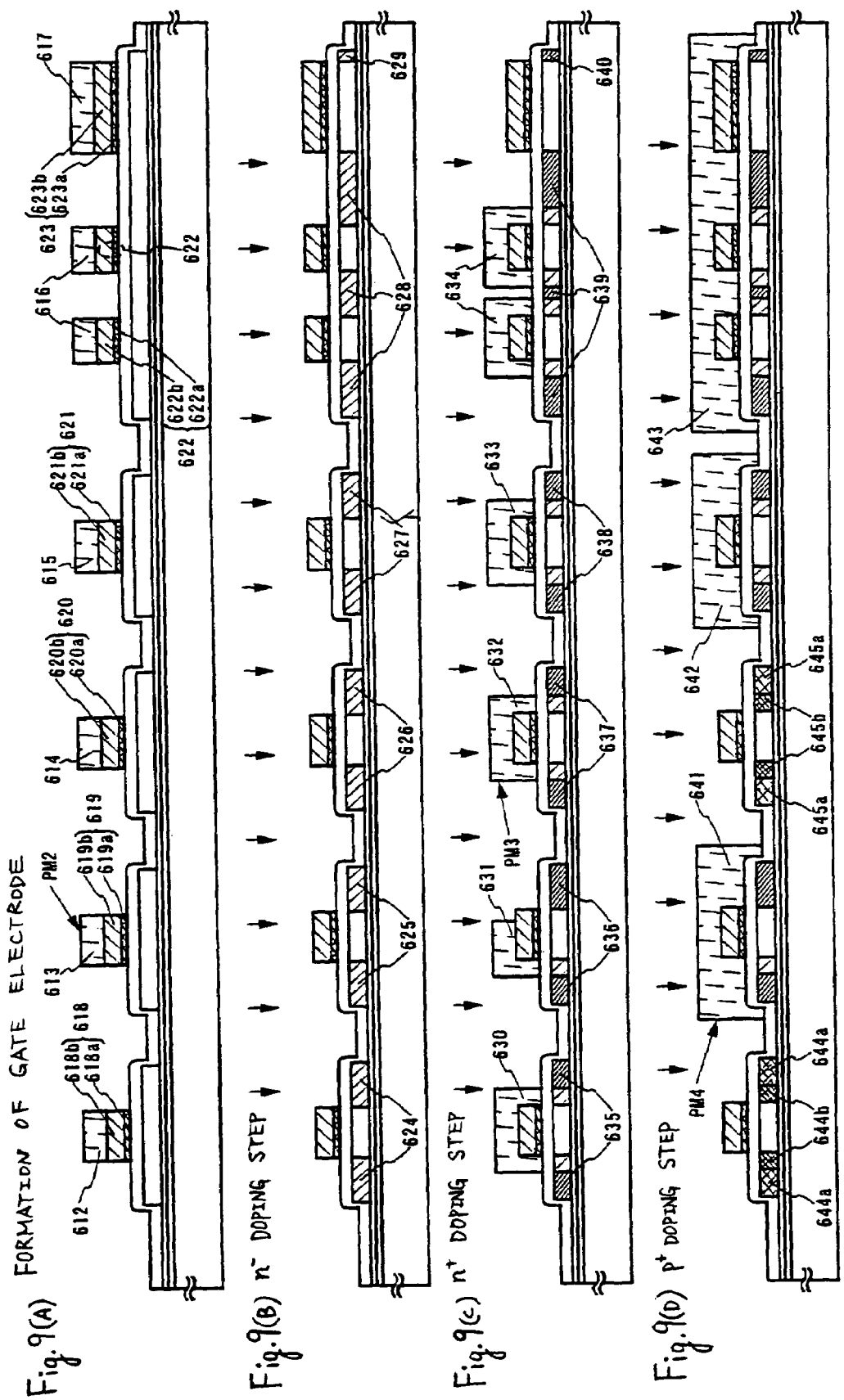

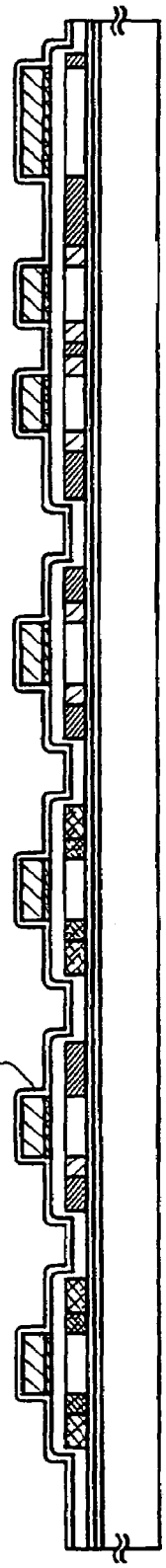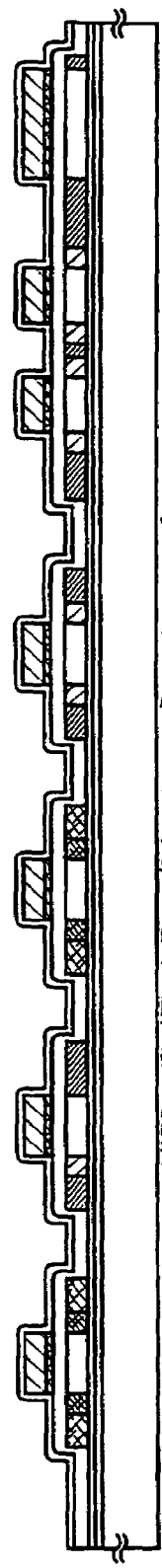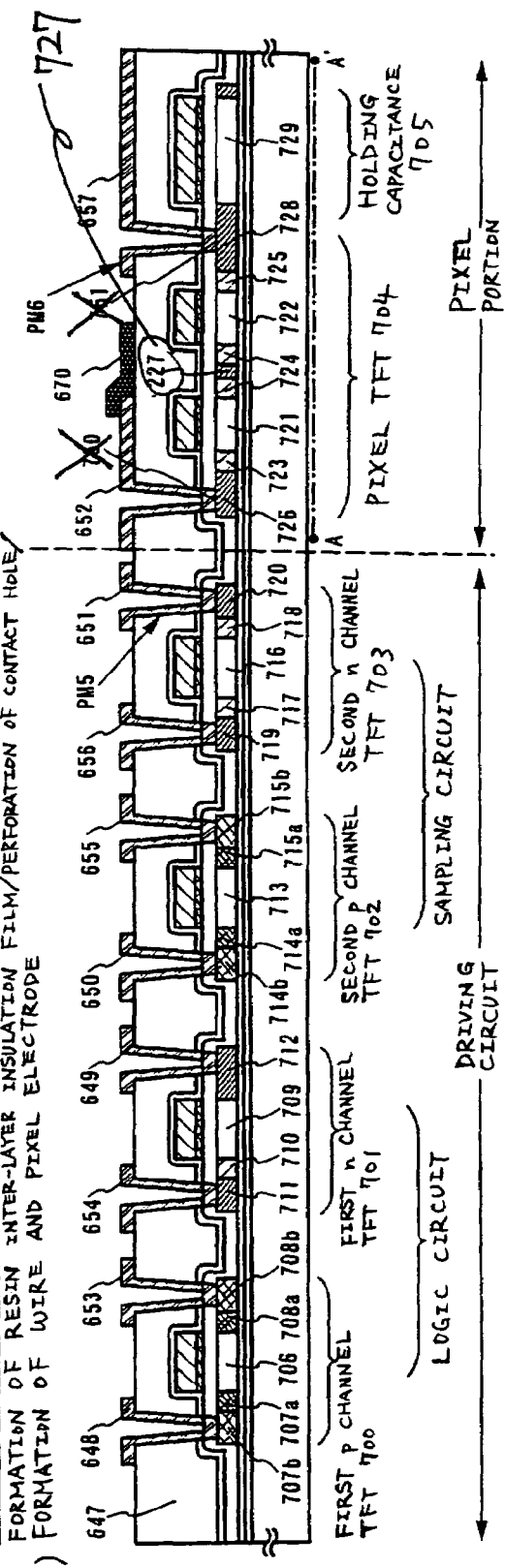
Fig. 10(A) FORMATION OF PROTECTIVE INSULATION FILM
Fig. 10(B) ACTIVATION STEP
Fig. 10(C) FORMATION OF RESIN INTER-LAYER INSULATION FILM/PERFORATION OF CONTACT HOLE / FORMATION OF WIRE AND PIXEL ELECTRODE

SEMICONDUCTOR DEVICE AND INTEGRAL IMAGE RECOGNITION/DISPLAY APPARATUS

BACKGROUND OF THE INVENTION

1. Field of the Invention

This invention relates to an apparatus integrally having both image recognition function and image display function. More particularly, this invention relates to an apparatus having an active matrix type display functional device comprising a plurality of thin film transistors (TFT) that are arranged in matrix.

2. Description of the Related Art

Information processing apparatuses such as personal computers have become wide spread in recent years, and the demand for reading a variety of information as electronic information into the personal computers has been increasing. Therefore, a scanner has drawn an increasing attention as means for reading the information printed on sheets of paper, and so forth.

However, the scanner is independent as a peripheral device, and is not free from the problems that the operation is difficult and an appropriate storage place is not easy to find out.

Under such circumstances, a liquid crystal panel having a unitary structure of a color scanner and a touch system panel has been put into practical application. The construction will be hereby explained briefly. A color scanner using a line sensor is put on a liquid crystal panel. When the scanner is used, a document is placed on the screen. The line sensor is allowed to scan to read the document. Therefore, this liquid crystal panel needs a large area and a large capacity.

Recently, a TFT technology using a polycrystalline silicon called "poly-silicon TFT" has been examined intensively. As a result, it has become possible to fabricate a driving circuit having a shift register circuit, etc, by using the poly-silicon TFT, and an active matrix type liquid crystal panel having a pixel unit and a peripheral driving circuit for driving the pixel unit on the same substrate has been put into practical application. Consequently, the liquid crystal panel has become smaller in size and weight, and has been used for the display unit of a variety of information processing apparatuses and portable apparatuses such as personal computers, video cameras, digital cameras, and so forth. Moreover, the development of self-light-emission type display devices such as organic EL has been under way.

Compact portable information processing terminals (or "mobile computers"), that have higher portability and is more economical and smaller in size than the notebook type personal computers, have gained a wider application nowadays, and the active matrix type liquid crystal panel has been used mainly for the display unit. In such information processing terminals, data can be inputted from the display unit by a touch-pen system. To input printed information on sheets of paper such as character and picture information and video information, however, it becomes necessary to connect a peripheral device for reading the image such as a scanner or a digital camera to the information processing terminal. Therefore, portability of the information processing terminal is lost. Also, an economical burden is applied to the user to purchase such a peripheral device.

The active matrix type liquid crystal display device has also been used for the display unit of a TV conference system, a TV telephone system and an Internet terminal. Such systems and terminals include a camera (CCD camera) for taking the picture of the speaker or the user. However, the display unit and the read unit (sensor unit) are produced separately and individually and are modulated together. Therefore, the production cost is high.

In addition, the biggest feature of the portable information terminal is its portability. Therefore, the capacity of the portable information terminals is preferably as small as possible. Various attempts have been made to reduce the capacity by, for example, miniaturizing the components, but scale-down is practically limited to a certain level because the operation time provided by the cell unit as a power source cannot be sacrificed. It has thus been necessary not only to improve the cell but also to restrict power consumption of the terminal itself so as to reduce the capacity of the cell components and to secure a predetermined operation time.

It has been pointed out that the major proportion of this power consumption are occupied by the light source required for the liquid crystal display device.

SUMMARY OF THE INVENTION

In view of the problems described above, it is therefore an object of the present invention to provide a novel, integral image recognition/display apparatus that has a pixel matrix and an image sensor, and a driving unit for driving them, or in other words, both image recognition function and display function, and that is constituted into an "intelligent" configuration.

It is another object of the present invention to provide economically a novel, "intelligent" semiconductor device by establishing matching between the construction and production process of an image sensor and the construction and production process of active devices.

To accomplish this object, the present invention incorporates a semiconductor device of a display pixel matrix portion and peripheral driving circuit semiconductor device, for displaying an image, and a sensor portion for inputting the image information inside the same panel. In this case, the sensor portion is disposed on a substrate on which the active devices for display are disposed. In this way, various effects can be obtained. On the other hand, the sensor portion may be disposed on the side of an opposed substrate that constitutes a display panel.

The display device for displaying the image has both electrode portion for reflecting the rays of light and an electrode portion for transmitting the rays of light in the pixel that is the minimum unit of the screen. The construction of the present invention is as follows.

According to one aspect of the present invention, there is provided an integral image recognition/display apparatus including a plurality of pixel portions each having an active device and arranged in matrix and each having a pixel electrode using a reflecting material and a light-transmitting material over an active matrix substrate, and a plurality of sensor portions arranged in matrix over the active matrix substrate, wherein the sensor portion includes a photoelectric conversion device, and can read information by utilizing the rays of light transmitting through the light-transmitting material when an external image is read. In addition, the active device in this case comprises a top gate type TFT or a bottom gate type TFT to achieve the respective object.

According to another aspect of the present invention, there is provided an integral image recognition/display apparatus including a plurality of pixel portions each having an active device and arranged in matrix and each having a pixel electrode using a reflecting material and a light-transmitting material over an active matrix substrate and a plurality of sensor portions disposed in matrix over an opposed substrate constituting a display panel, wherein the sensor portion has a photo-electric conversion device and can read information by utilizing the rays of light transmitting through the light-transmitting material when an external image is read.

In addition, the object can also be accomplished when color filters are disposed on the opposed substrate in the construction described above.

According to still another aspect of the present invention, there is provided an integral image recognition/display apparatus including a plurality of pixel portions each having an active device and arranged in matrix and each having a pixel electrode using a reflecting material and a light-transmitting material over an active matrix substrate and a plurality of sensor portions arranged in matrix over the active matrix substrate, wherein the sensor portion has a photo-electric conversion device, and at least a part of the photo-electric conversion device is extended in such a manner as to overlap with the active devices to achieve the object as described above.

According to still another aspect of the present invention, there is provided an integral image recognition/display apparatus including an active matrix substrate having a plurality of pixel portions each having an active device and arranged in matrix and a plurality of sensor portions arranged in matrix over the active matrix substrate, wherein a pixel capacitance portion provided to the pixel functions also as a capacitance portion for image recognition, disposed in the sensor portion. The object described above can also be accomplished when a reflecting material and a light-transmitting material are used for a pixel electrode in the construction described above.

The object described above can be also accomplished when a reflecting material and a light-transmitting material are used for the pixel electrode, and these materials also serve as at least a part of the electrode that constitutes the capacitance portion for image recognition, disposed in the sensor portion.

BRIEF DESCRIPTION OF THE DRAWINGS

FIG. 5 is a sectional view of an active matrix substrate in the integral image recognition/display apparatus according to a certain embodiment of the present invention;

FIGS. 8(A) to 8(D) are sectional views showing a production method of the integral image recognition/display apparatus according to the present invention;

FIGS. 9(A) to 9(D) are sectional views showing a production method of the integral image recognition/display apparatus according to the present invention;

FIGS. 10(A) to 10(C) are sectional views showing a production method of the integral image recognition/display apparatus according to the present invention;

DESCRIPTION OF THE PREFERRED EMBODIMENTS

Hereinafter, typical embodiments of the present invention will be explained with reference to the drawings. Incidentally, the integral image recognition/display apparatus according to the present invention is not particularly limited to the following embodiments.

Figure 1:
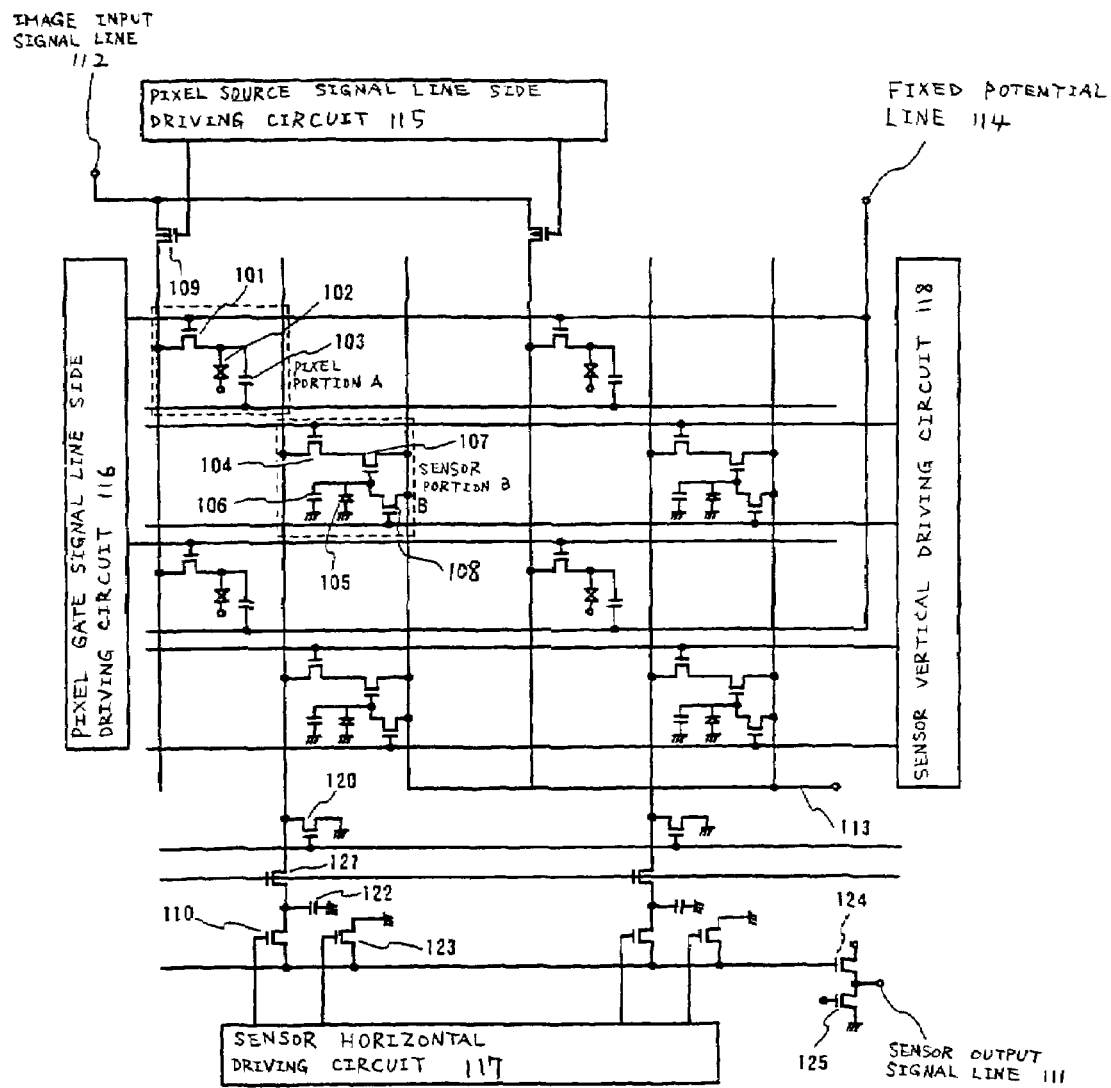
FIG. 1 is a circuit diagram of an integral image recognition/display apparatus according to a certain embodiment of the present invention.

Reference is first to be had to FIG. 1. FIG. 1 shows an example of the circuit construction that can be applied to the integral image recognition/display apparatus of the present invention. Though FIG. 1 shows a circuit construction of a semiconductor device having 2×2 (vertical×horizontal) pixels for the sake of explanation, a greater number of pixels are formed in practice on a substrate. In the case of a display apparatus of the VGA standard, for example, the number of pixels is 640×480, and is 800×600 in the SVGA standard. Peripheral driving circuits are represented simply by blocks.

Reference numeral 101 denotes a pixel TFT. Reference numeral 102 denotes a liquid crystal. Reference numeral 103 denotes an auxiliary capacitance. Reference numeral 104 denotes a sensor TFT. Reference numeral 105 denotes a photo diode PD. Reference numeral 106 denotes an auxiliary capacitance. Reference numeral 107 denotes a signal amplification TFT. Reference numeral 108 denotes a reset TFT. Reference numerals 109 and 110 denote analog switches. Reference numeral 120 denotes a bias TFT. Reference numeral 121 denotes a transfer TFT. Reference numeral 122 denotes a sample-and-hold capacitance. Reference numeral 123 denotes a discharge TFT. Reference numeral 124 denotes an amplification TFT for a final buffer. Reference numeral 125 denotes a bias TFT for a final buffer. The circuit comprising these members 101 to 108 will be called a "matrix circuit".

The members 101 and 103 are called the "pixel portion A". The members 104 to 108 are called the "sensor portion B". Reference numeral 111 denotes a sensor output signal line, and reference numeral 112 denotes an image input signal line. Reference numerals 113 and 114 denote fixed potential lines. Reference numeral 115 denotes a pixel source signal line side driving circuit. Reference numeral 116 denotes a pixel gate signal line side driving circuit. Reference numeral 117 denotes a sensor horizontal driving circuit. Reference numeral 118 denotes a sensor vertical driving circuit.

To display the image, the integral image recognition/display apparatus according to the present invention supplies image signals (gradation voltages) inputted from the image input signal line to the pixel TFT through the pixel source signal line side driving circuit 115 and the pixel gate signal line side driving circuit 116, and drives the liquid crystal sandwiched between the pixel electrodes connected to the pixel TFT and the opposed electrodes, thereby displaying the image. In FIG. 1, the pixel source signal line side driving circuit 115 and the pixel gate signal line side driving circuit 116 are shown as analog driving circuits that handle analog signals. However, they are not limited to the analog driving circuits. In other words, a digital driving circuit having mounted thereto a D/A conversion circuit for handling digital image signals can be used, as well.

In the integral image recognition/display apparatus according to the present invention, the photo diode PD 105 as a photoelectric conversion device reads the incident external image information (optical signals), and converts them to electric signals. The sensor horizontal driving circuit 117 and the sensor vertical driving circuit 118 input the image. The image signals are inputted to other peripheral circuit (memory, CPU, etc) through the sensor output signal line 111.

Figure 2:
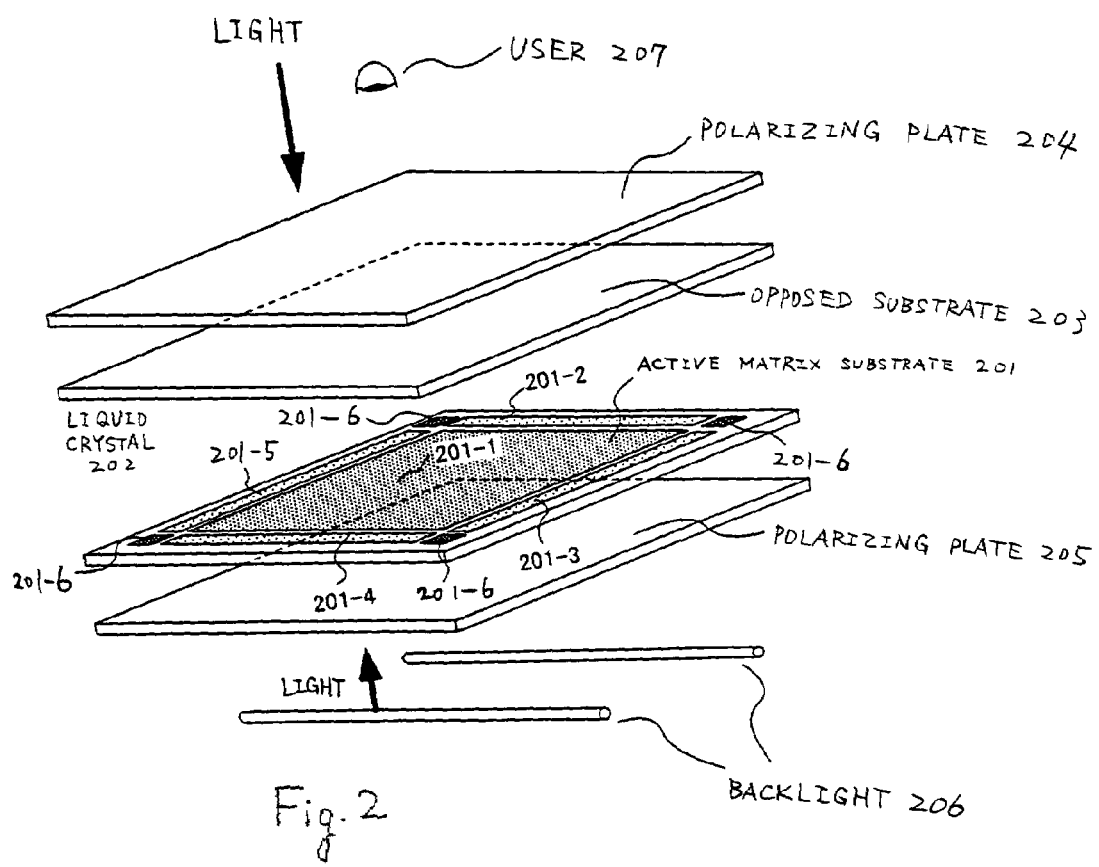
FIG. 2 is an exploded view of the integral image recognition/display apparatus according to the present invention.
Figure 3:
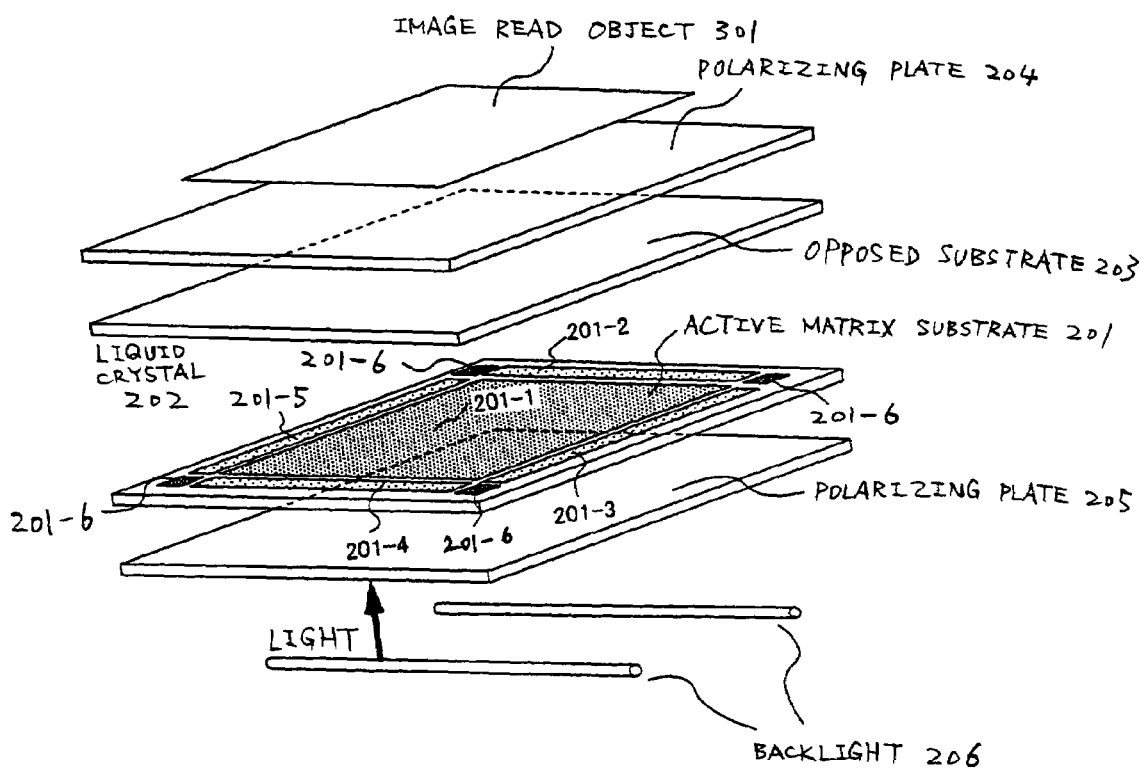
FIG. 3 is an exploded view of the integral image recognition/display apparatus according to the present invention.

FIGS. 2 and 3 are exploded views of the integral image recognition/display apparatus under the state where it is exploded into the constituent components. The gaps between the constituent components are shown enlarged for the sake of explanation. In FIGS. 2 and 3, the semiconductor device of the present invention is used as "normally white" (white display when no voltage is applied) in a TN (twist nematic) mode. Liquid crystal display methods in other modes such as an STN mode, an ECB mode, a birefringence mode utilizing an FLC, an AFLC liquid crystal, or a so-called "V-shape liquid crystal", and so forth, can also be employed. It is also possible to employ "normally black" (black display when no voltage is applied).

Reference is to be made next to FIG. 2. FIG. 2 shows the case where the semiconductor device according to the present invention is used in the image display mode. Reference numeral 201 denotes an active matrix substrate. It includes the matrix circuit 201-1, the pixel source signal line side driving circuit 201-2, the pixel gate signal line side driving circuit 201-3, the sensor horizontal driving circuit 201-4, the sensor vertical driving circuit 201-5 and other peripheral circuits 201-6 that have been explained with reference to FIG. 1. Incidentally, an orientation film, or the like, is formed over the upper surface of the active matrix substrate, but is hereby omitted in the drawing.

A liquid crystal material exists in the region suggested by reference numeral 202, that cannot be indicated in practice in this schematic view. Reference numeral 203 denotes an opposed substrate including a transparent electrode and an orientation film (both not shown). Reference numerals 204 and 205 denote polarizing plates, that are so arranged as to constitute the cross-Nicol arrangement with each other. Reference numeral 206 denotes backlight. Reference numeral 207 shows (an illustrated eye of) the user. It represents that the user observes from above the semiconductor device of the present invention. A glass substrate or a plastic substrate (not shown) is provided on the upper polarizing plate 204 to prevent scratches and dust from attaching to the polar plate.

Figure 4:
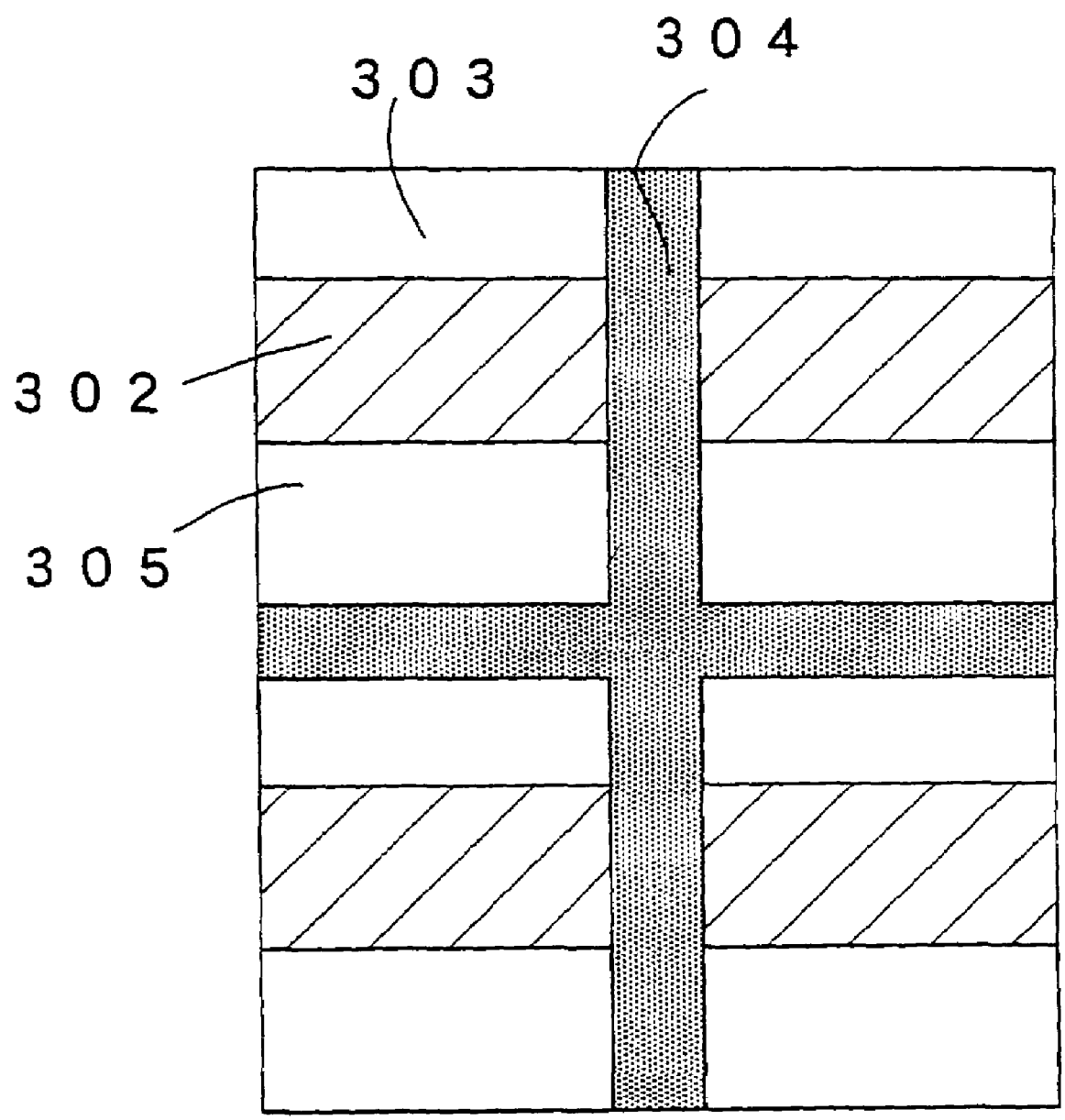
FIG. 4 is a schematic arrangement diagram of the integral image recognition/display apparatus near its pixel unit according to the present invention.
Figure 6A:
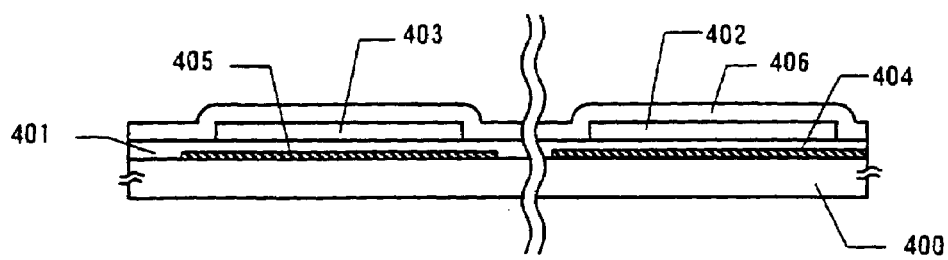
FIGS. 6(A) to 6(D) are sectional views showing a production method of the integral image recognition/display apparatus according to the present invention.
Figure 6B:
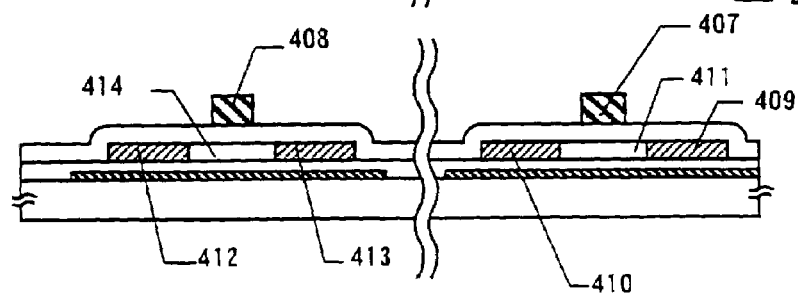
Figure 6C:
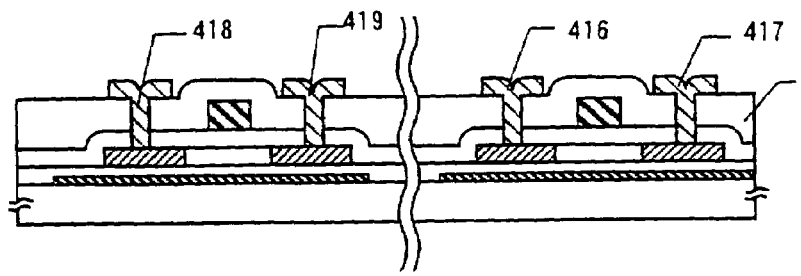
Figure 6D:
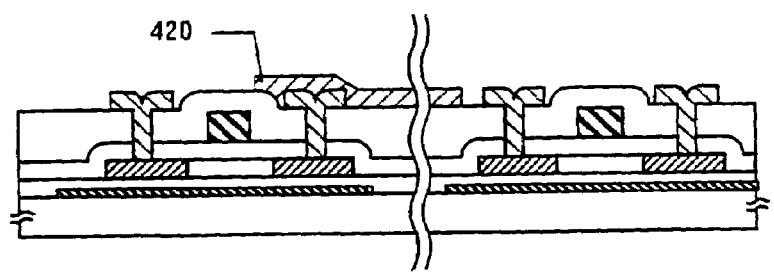

Pixel electrodes for display are disposed on the active matrix substrate 201. FIG. 4 shows this pixel portion. This pixel electrode generally uses light-transmitting ITO, or the like, but the present invention uses a light-transmitting material and a reflecting material such as aluminum so that the light-transmitting portion and the light-reflecting portion partially co-exist in the pixel.

Layout of the light-transmitting portion inside the pixel can be determined arbitrarily, and the position, the area ratio, etc, can be changed in accordance with the characteristics required for the integral image recognition/display apparatus of the present invention. FIG. 4 shows an example of 2×2 pixels. In FIG. 4, the light-transmitting electrode 305 and the sensor window 303 are arranged in such a fashion as to interpose the reflecting electrode 302 for display between them. According to this arrangement, the light-transmitting window 303 for sensor is encompassed by the reflecting electrode 302 and by BM 304 that is so formed as to encompass the pixel. Therefore, the ray of light to the sensor is not incident from other regions at the time of reading of the image, and the read mistake of the information can be reduced.

When the semiconductor device of the present invention is used in the image display mode, the gradation voltage is supplied to the pixel TFT on the basis of the image signal supplied (that may be the signal stored in the built-in memory or the signal supplied from outside) to drive the liquid crystal 202. Incidentally, color display can also be conducted by using color filters. In addition, when display is made without turning on the backlight 206, the apparatus can be used as the reflection type display panel by the reflecting electrodes 302, and power consumption can be reduced. When the condition of the use of the apparatus is dark and the display cannot be viewed sufficiently in the reflection mode, the backlight is turned on so that the display can be made by the transmitting electrodes 305. In this way, power consumption of the panel can be adjusted, whenever necessary.

Next, reference is to be made to FIG. 3. This drawing shows the case where the integral image recognition/display apparatus of the present invention is used in the image read mode. For the detail of the constituent components of this apparatus, reference is to be made to the explanation of FIG. 2. Reference numeral 301 denotes an image read object that is a name card or a photo, for example. In FIG. 3, the image read object 301 is shown disposed in the spaced-apart relation with the polarizing plate (or the glass substrate or plastic substrate, not shown), it is preferably disposed in close contact with the polarizing plate.

When the integral image recognition/display apparatus of the present invention is used in the image read mode, no voltage is applied to the pixel TFT, and display by all the pixels is white display. In this way, the rays of light from backlight 206 are irradiated to the surface of the image read object 301 through the transmitting electrode 305 for display. The rays of light so irradiated to the surface of the image read object (document) 301 are reflected by the surface of the image read object 301.

The reflected rays of light have at this time have image information of the image read object 301. The reflected rays of light pass through the glass substrate (not shown), the polarizing plate, the opposed substrate, the liquid crystal, and through the sensor transmitting window 303 of the pixel portion, and are detected by the photo diode PD disposed in the sensor portion B of the active matrix circuit of the active matrix substrate. The photo diode PD is positioned exactly to this window 303, and converts the rays of light to electric signals.

The image information thus converted to the electric signals are taken out from the sensor output signal line as described above, and are stored in the memory (which may be formed on the same substrate or may be disposed outside). In this way, the image of the image read object 301 is inputted.

The explanation given above represents the case where the name card or the photo is brought into close contact with the integral image recognition/display apparatus of the present invention. However, the image of a landscape or a person that is taken by a digital camera, or the like, can be also inputted. In this case, the image is recognized without turn-on of the backlight 206.

When the image converted to the electric signals by the sensor portion B is displayed by the pixel portion A, the image display can be made substantially on the real-time basis. The pixel unit A may be constituted so that it can display the data from outside the integral image recognition/display apparatus.

Next, the sectional structure of the active matrix substrate constituting the integral image recognition/display apparatus will be explained. Reference is to be had to FIG. 5. The sensor portion A and the sensor portion B are disposed inside one pixel as shown in FIG. 4.

FIG. 5 shows the pixel TFT and the sensor TFT. A shading film 404 of the pixel TFT is disposed on the substrate 400 to protect the pixel TFT from the rays of light incident from the back. Another shading film 405 may be disposed on the sensor TFT on the side of the sensor portion B as shown in the drawing. The reset TFT or the signal amplification TFT (both being not shown in the drawing) of the sensor portion B may be provided with the shading film (not shown). These shading films may be directly disposed on the back of the substrate 400.

After the underlying film 401 is formed on these shading films 404 and 405, the pixel TFT of the display portion A, the sensor TFT, the signal amplification TFT and the reset TFT of the sensor portion B, and the TFT constituting the driving circuit and the peripheral circuit are formed simultaneously. Incidentally, the term "back of the substrate 400" means the substrate surface on which the TFT is not formed. These TFT may be of the top gate type TFT or the bottom gate type TFT. FIG. 5 shows the case of the top gate TFT, by way of example.

A lower electrode 420 to be connected to the electrode 419 of the sensor TFT is then formed. This lower electrode 420 constitutes the lower electrode of the photo diode (photoelectric conversion device), and is formed in the pixel region other than the upper portion of the pixel TFT. A photoelectric conversion layer 421 is disposed on this lower electrode 420 and a top electrode 422 is disposed further on this photoelectric conversion layer 421. The photo diode is thus completed. Incidentally, the top electrode 422 uses a transparent electrode.

On the other hand, a pixel light-transmitting electrode 424 to be connected to the electrode 416 is provided to the pixel TFT of the pixel portion. A reflecting electrode 425 is formed in contact with this electrode. The reflecting electrode is shown laminated on the light-transmitting electrode 424 in FIG. 5. However, it is possible to pattern the light-transmitting electrode 424 so as to achieve the construction that partly comes into contact with the reflecting electrode 425 and includes the portion having only the reflecting electrode and the portion having only the light-transmitting electrode. The present invention embraces also such a construction within its scope.

This pixel light-transmitting electrode 424 may have a structure to cover the sensor portion B and the lead wires. As described already, the reflecting electrode and the light-transmitting electrode can be arranged at arbitrary positions. In FIG. 5, the sizes of the pixel portion A and the sensor portion B are different from the actual sizes for the sake of explanation. This size is one of the design matters that can be changed in accordance with the specification of the integral image recognition/display apparatus.

When the pixel light-transmitting electrode 424 has the structure that covers the lead wires, the insulation film existing between the lead wire and the pixel electrode is used as a dielectric, and a display pixel capacitance is formed.

The production process of the active device adaptable to the apparatus of the present invention is substantially the same as the production process of the conventional display device with the exception that the production process of the photo sensor as the photoelectric conversion device is added. The construction of this photo sensor can be formed by laminating, or bring into mutual contact, different conductivity types such as PIN, PI, NI, and so forth, or laminating or bringing into mutual contact, different materials such as Schottky junctions and hetero junctions, or by utilizing photo-susceptibility of the semiconductor material itself.

Since the conventional production process can be thus used, the apparatus of the present invention can be produced easily and economically. Even when the sensor function is mounted, the shape and the size of the apparatus of the present invention remain the same as those of the conventional panel. Therefore, the size and the weight can be reduced.

Embodiments

Several concrete embodiments of the semiconductor device of the present invention will be described, but the invention is in no way limited thereto.

Embodiment 1

The production process of one embodiment of the present invention will be explained with reference to FIGS. 6 and 7 that are sectional views. In the explanation that follows, the pixel TFT and the sensor TFT will be explained as typical examples, but the reset TFT, the signal amplification TFT, and the p channel TFT and the n channel TFT constituting the analog switch, the driving circuit and the peripheral circuit, can be fabricated simultaneously. The positional relationship of the pixel light-transmitting electrode, the pixel reflecting electrode and the sensor window has a planar arrangement relationship as shown in FIG. 4.

Reference is to be made to FIG. 6. First, an underlying film 401 is formed on the entire surface of a transparent substrate 400. A glass substrate or a quartz substrate each having transparency can be used for the transparent substrate 400. A silicon oxide film is formed to a thickness of 150 nm as the underlying film 401 by a plasma CVD process. Before this underlying film is formed, a shading film 404 for protecting the pixel TFT from the rays of light from the back and a shading film 405 for protecting the sensor TFT from the rays of light from the back are disposed. The shading films may comprise a metal material such as Ta, W or Cr or their compounds, or silicon or silicide, or their laminate with the metals.

Next, an amorphous silicon film is deposited to a thickness of 30 to 100 nm, preferably to 30 nm, by the plasma CVD process, and excimer laser beams are irradiated to the amorphous silicon film to form a polycrystalline silicon film. The crystallization method of the amorphous silicon film may be a thermal crystallization method called "SPC", a RTA method using infrared irradiation, a method that uses thermal crystallization with laser annealing, or their combination.

Next, the polycrystalline silicon film is patterned to form an island-like semiconductor layer 402 forming the source, drain and channel formation regions of the pixel TFT and an island-like semiconductor layer 403 forming the source, drain and channel formation regions of the sensor TFT. A gate insulation film 406 is then formed to cover these semiconductor layers. The gate insulation film 406 is formed by the plasma CVD process to a thickness of 100 nm by using silane ($SiH_2$) and $N_2O$ as the starting gases (FIG. 6(A)).

Next, a conductor film is formed. Aluminum is used as the material of the conductor film. However, the film may be made of Ta, W, TaN, WN, titanium, a film consisting of silicon as the principal component, or their laminate film. In this embodiment, the aluminum film is formed by sputtering to a thickness of 200 to 500 nm, typically to 300 nm. To restrict the occurrence of hillocks and whiskers, the aluminum film contains 0.04 to 1.0 wt % of scandium (Sc), titanium (Ti) or yttrium (Y).

Next, a resist mask is formed, and the aluminum film is patterned to form an electrode pattern. Pixel TFT gate electrodes 407 and sensor TFT gate electrodes 408 are then formed.

Next, an offset structure is formed by a known method. Alternatively, an LDD structure may be formed by a known method. In this way, impurity regions (source-drain regions) 409, 410, 412 and 413 and channel regions 411 and 414 are formed (FIG. 6(B)). Incidentally, FIG. 6 shows only the sensor TFT and the pixel TFT as the N channel TFT for the sake of explanation, but the P channel TFT is also formed. Phosphorus (P) or arsenic (As) as the impurity element is used for the N channel type, and boron (B) or gallium (Ga) is used for the P type.

The first inter-layer insulation film 415 is then formed, and contact holes reaching the impurity regions 409, 410, 412 and 413 are formed. Thereafter, a metal film is formed and is then patterned to give electrodes 416 to 419. At this time, lead wires for connecting a plurality of TFT are formed simultaneously.

In this embodiment, the first inter-layer insulation film 415 is formed of a 500 nm-thick silicon nitride film. Besides the silicon nitride film, a silicon oxide film or a silicon nitride film can be used. Alternatively, a multi-layered film of these films can be used, too.

In this embodiment, a laminate film comprising a titanium film, an aluminum film and a titanium film is formed by sputtering as the metal film that is the starting film of the electrodes and the lead wires. The thickness of these films is 100 nm, 300 nm and 100 nm, respectively. The pixel TFT and the sensor TFT are completed simultaneously after the process steps described above (FIG. 6(C)).

Next, a metal film is formed in contact with the first inter-layer insulation film 415 and the drain electrode 419 of the sensor TFT. The metal film is patterned to form the lower electrode 420 of the photoelectric conversion device. Though this embodiment uses aluminum for this metal film by sputtering, other metals can be used, too. For example, a laminate film comprising a titanium film, an aluminum film and a titanium film can be used. In this embodiment, the lead wires 419 for the TFT and the electrode 420 for the sensor are formed by separate process steps, but they may be formed by the same step.

In this case, the sensor electrode 420 can be easily formed by changing the mask pattern used for forming the drain electrode 419. On the contrary, the simultaneous formation provides the advantages such as the reduction of the cost and the improvement of yield resulting from the decrease of the number of process steps. In addition, the drain electrode 419 and the sensor electrode 420 are preferably formed simultaneously in the case of the liquid crystal display because disturbance of the liquid crystal orientation is likely to develop if corrugation of the active matrix substrate is vigorous.

Figure 7A:
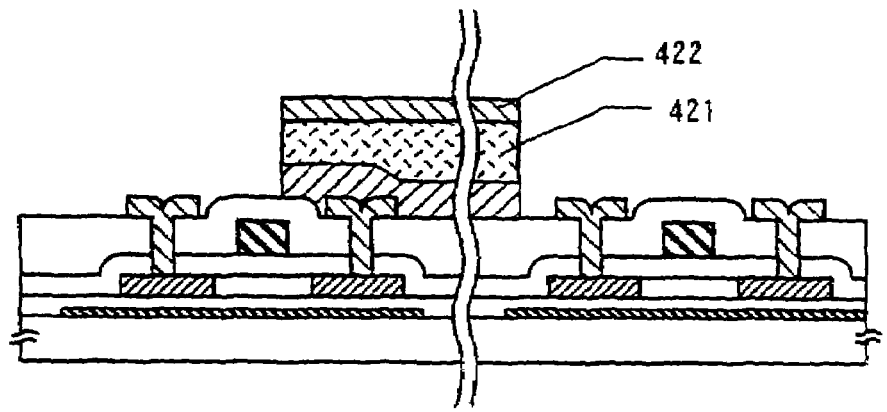
FIGS. 7(A) to 7(C) are sectional views showing a production method of the integral image recognition/display apparatus according to the present invention.
Figure 7B:
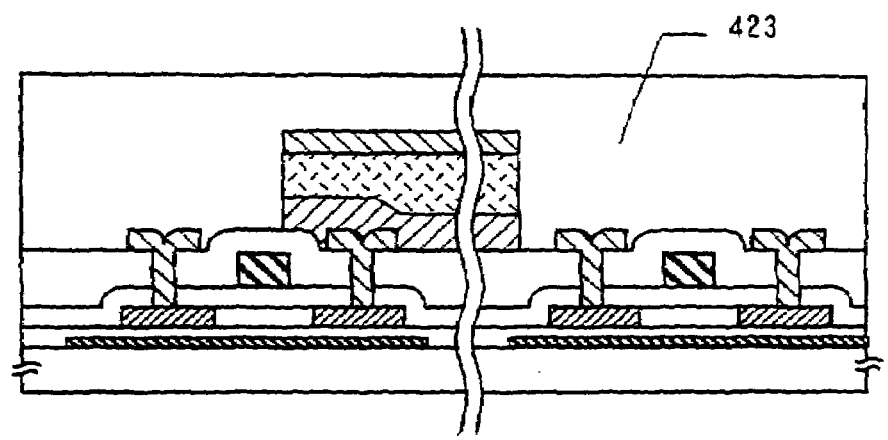

Reference is made next to FIG. 7. A hydrogen-containing amorphous silicon film (hereinafter called "a-Si: H film"), that functions as a photoelectric conversion layer, is formed over the entire surface of the substrate and is then patterned to form the photoelectric conversion layer 421 (FIG. 7(A)).

Next, a transparent conductor film is formed over the entire surface of the substrate. This embodiment uses a 200 nm-thick ITO formed by sputtering as the transparent conductor film. This transparent conductor film is patterned to form a top electrode 422 (FIG. 7(A)).

A second inter-layer insulation film 423 is then formed. When a resin film such as a polyimide, polyamide, polyimidamide or acrylic resin is formed as the insulation film that constitutes the second inter-layer insulation film, a flat surface can be obtained desirably. Alternatively, a laminate structure can be used. The resin film described above is used as the upper layer of the second inter-layer insulation film, and a single-layered or multi-layered film of an inorganic material such as silicon oxide, silicon nitride or silicon oxide nitride may be formed as the lower layer of the second inter-layer insulation film. This embodiment forms a 0.7 µm-thick polyimide film as the insulation film over the entire surface of the substrate (FIG. 7(B)).

Contact holes reaching the drain electrode 416 are formed in the second inter-layer insulation film 423. A light-transmitting film consisting of zinc oxide as the principal component is again formed over the entire surface of the substrate and is patterned to form pixel light-transmitting electrodes 424 connected to the respective pixel TFT. Next, aluminum as a reflecting electrode material is formed to a thickness of 200 nm on the upper surface of the light-transmitting film and is then etched with a predetermined mask pattern, forming pixel reflecting electrodes 430. The light-transmitting electrode and the reflecting electrode come often into mutual contact or react with each other during etching by an acidic solution. To prevent such contact and reaction, caution must be paid to the combination of the electrode materials. This embodiment uses the combination of ZnO—Al, but an ITO—Ti or a combination of a mixture of ITO and zinc with Al, Ti, Cr, or a mixture thereof or a multi-layer thereof can be used.

Figure 7C:
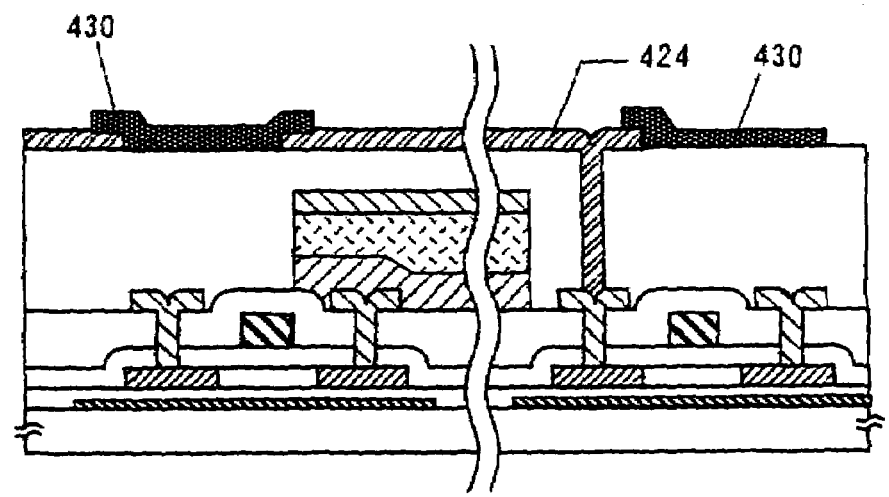

After the process steps described above are completed, the active matrix substrate shown in FIG. 7(C) can be completed.

The active matrix substrate and the opposed substrate are bonded to each other by a sealant, and after the liquid crystal is charged between them, the integral image recognition/display apparatus is completed. The opposed substrate is obtained by forming a transparent conductor film and an orientation film on a transmitting substrate. A black mask, a color filter, or the like, may be further disposed on the substrate, whenever necessary.

Figure 11A:
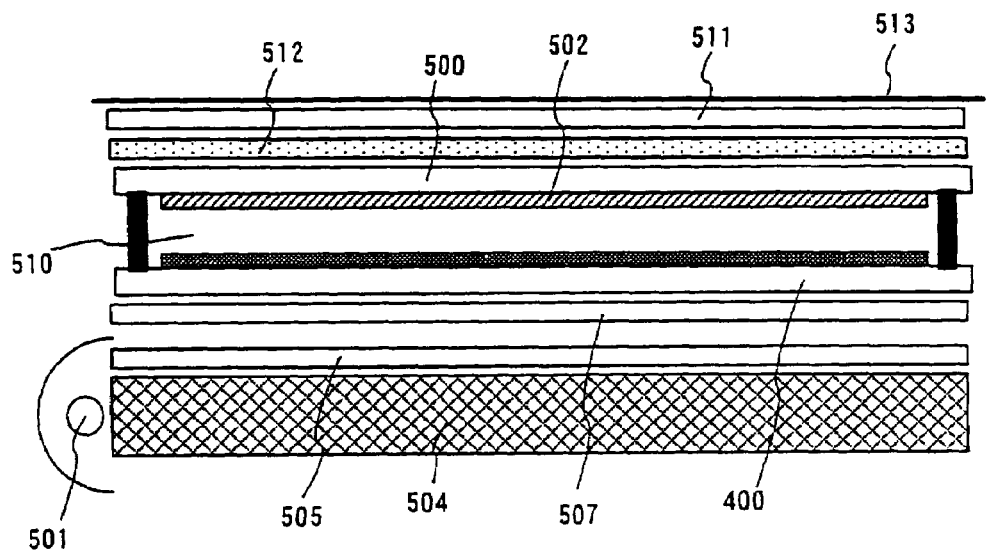
FIGS. 11(A) and 11(B) are sectional views showing the schematic construction of the integral image recognition/display apparatus according to the present invention.

The active matrix substrate 400, which includes the sensor portion and the pixel portion formed on the same substrate, and the opposed substrate 500 equipped with the color filter 502 are bonded to assemble the liquid crystal panel. FIG. 11(A) is a schematic view of the liquid crystal panel. According to this construction, the integral image recognition/display apparatus that is not bulky and has high portability can be accomplished. The image displaying and recognizing method is the same as the one described above.

This apparatus can selectively use the display device in the reflection mode and in the transmission mode depending on the place of use, and can read the document by the rays of light from the back-light 501 transmitting through the light-transmitting electrodes of the pixel electrodes during the image recognition, while power consumption is restricted. Consequently, the capacity of the PDA (portable personal terminal) with the built-in integral image recognition/display apparatus can be made extremely small, and the read function of the name card and the photo or the read function of the digital camera, can be accomplished.

A sheet 512 that adds optical effects can be interposed between the polarizing plate 511 and the opposed substrate. When an optical fiber sheet is disposed as the sheet, a greater quantity of light can be utilized. When a lens array sheet is disposed, the rays of light from the document can be image-formed on the sensor, and the read error can be further reduced.

The present invention will be explained in further detail with reference to the following embodiments.

Embodiment 2

A production example of the TFT devices that can be applied to the integral image recognition/display apparatus of the present invention will be explained with reference to FIGS. 8 to 10. The method of forming simultaneously the pixel TFT and the holding capacitance of the pixel portion and TFT of the driving circuit disposed round the display region will be explained hereby step-wise and in detail.

In FIG. 8(A), the substrate 601 can use barium borosilicate glass or alumino borosilicate glass as typified by Corning #7059 glass and #1737 glass, and plastic substrates not having optical anisotropy, such as polyethylene terephthalate (PET), polyethylene naphthalate (PEN), polyethersulfone (PES), and so forth. When the glass substrate is used, heat-treatment is preferably conducted in advance at a temperature lower by about 10 to about 20° C. than the glass strain point.

An underlying film 602 such as a silicon oxide film, a silicon nitride film or a silicon oxide nitride film is formed on the surface of the substrate 601, on which the TFT is to be formed, to prevent the diffusion of impurities from the substrate 601. For example, a silicon oxide nitride film 602*a* is formed from $SiH_4$, $NH_3$ and $N_2O$ to a thickness of 10 to 200 nm (preferably, 50 to 100 nm) by the plasma CVD process. Similarly, a hydrogenated silicon oxide nitride film 602*b* is formed from $SiH_4$ and $N_2O$ to a thickness of 50 to 200 nm (preferably 100 to 150 nm) and is laminated on the former.

The silicon oxide nitride film is formed by using the conventional parallel flat sheet type plasma CVD process. To form the silicon oxide nitride film 602*a*, $SiH_4$, $NH_3$ and $N_2O$ are introduced into a reaction chamber at the rates of 10 sccm, 100 sccm and 20 scccm, respectively, and are reacted at a substrate temperature of 325° C., a reaction pressure of 40 Pa, a discharge power density of 0.41 $W/cm^2$ and a discharge frequency of 60 MHz. To form the silicon oxide nitride film 602*b*, on the other hand, $SiH_4$, $N_2O$ and $H_2$ are introduced into the reaction chamber at the rates of 5 sccm, 120 sccm and 125 sccm, respectively, and are reacted at a substrate temperature of 400° C., a reaction pressure of 20 Pa, a discharge power density of 0.41 $W/cm^2$ and a discharge frequency of 60 MHz. These films can also be formed continuously as the substrate temperature is changed and only the reaction gases are switched.

The silicon oxide nitride film 602*a* thus formed has a density of $9.28 \times 10^{22}/cm^3$, and has a low etching rate of about 63 nm/min in a mixed etching solution (LAL500, a product of Stella Chemifa Co.) containing 7.13% of ammonium hydrogenfluoride ($NH_4HF_2$) and 15.4% of ammonium fluoride ($NH_4F$) at 20° C. It is a compact and hard film, and is effective for preventing the diffusion of alkali metal elements from the glass substrate into the semiconductor layers to be formed on the substrate.

Next, a semiconductor layer 603*a* having an amorphous structure is formed to a thickness of 25 to 80 nm (preferably 30 to 60 nm) by a known method such as plasma CVD or sputtering. For example, the amorphous silicon film is formed to a thickness of 55 nm by plasma CVD. Examples of the semiconductor film having the amorphous structure includes an amorphous semiconductor film and a microcrystalline semiconductor film, and a compound semiconductor film having the amorphous structure such as an amorphous silicon germanium film can be used, too.

The underlying film 602 and the amorphous semiconductor layer 603*a* can be formed continuously, too. For example, after the silicon oxide nitride film 602*a* and the hydrogenated silicon oxide nitride film 602*b* are formed continuously by the plasma CVD process as described above, the reaction gases are switched from $SiH_4$, $N_2O$ and $H_2$ to $SiH_4$ and $H_2$ or to $SiH_4$ alone. In this way, these films can be formed continuously without being exposed once to the open air atmosphere. As a result, since contamination of the surface of the hydrogenated silicon oxide nitride film 602*b* can be prevented, variance of the characteristics of the TFT and fluctuation of their threshold voltages can be lowered.

The crystallization step is conducted to from a crystalline semiconductor layer 603*b* from the amorphous semiconductor layer 603*a*. The crystallization method may be a laser annealing method, a thermal annealing method (solid phase growing method) or a rapid thermal annealing method (RTA method). When the glass substrate or the plastic substrate having low heat resistance is used as described above, the laser annealing method is particularly preferred. The RTA method uses an IR lamp, a halogen lamp, a metal halide lamp or a xenon lamp as the light source.

The crystalline semiconductor layer 603*b* can be formed in accordance with the crystallization method using a catalytic element, as described in Japanese Patent Laid-Open No. 7-130652. In the crystallization step, it is preferred to emit first hydrogen contained in the amorphous semiconductor layer. Heat treatment is conducted at 400 to 500° C. for one hour to lower the hydrogen content to 5 atom % or below, and crystallization is then effected. In this way, coarsening of the film surface can be prevented.

When crystallization is carried out by the laser annealing method, a pulse oscillation type or continuous emission type excimer laser or argon laser is used as the light source. When the pulse oscillation type excimer laser is used, the laser beam is processed into the linear shape and then laser annealing is carried out. The laser annealing condition can be selected and adjusted appropriately by the operator. An example of such a condition is a laser pulse oscillation frequency of 30 Hz and a laser energy density of 100 to 500 $mJ/cm^2$ (typically, 300 to 400 $mJ/cm^2$). The linear beams are irradiated to the entire surface of the substrate, and the overlap ratio of the linear beams at this time is 80 to 98%. In this way, the crystalline semiconductor layer 603*b* can be obtained as shown in FIG. 8(B).

A resist pattern is formed on the crystalline semiconductor layer 603*b* by photolithography using a photo-mask 1 (PM1), and is dry etched into island-like semiconductor layers 604 to 608. Dry etching uses a mixed gas of $CF_4$ and $O_2$.

An impurity element that imparts the p type may be added to the island-like semiconductor layer in a dose of $1\times10^{16}$ to $5\times10^{17}$ atoms/cm$^3$ so as to control the threshold voltage (Vth) of the TFT. The elements of the Group 13 of the Periodic Table such as boron (B), aluminum (Al) and gallium (Ga) are known as the impurity elements that impart the p type to the semiconductor.

Ion injection or ion doping maybe used to add such impurity elements, but ion doping is suitable for processing a large area substrate. Ion doping adds boron (B) by using diborane ($B_2H_6$) as the source gas. Injection of such impurity elements is not essentially necessary and may be omitted. However, this is the method that can be used suitably for controlling the threshold voltage of the n channel TFT, in particular, to a predetermined range.

Plasma CVD or sputtering is employed to form the gate insulation film 609. A silicon-containing insulation film is thus formed to a thickness of 40 to 150 nm. For example, it is advisable to form the film from a silicon oxide nitride film to a thickness of 120 nm. The silicon oxide nitride film formed by adding $O_2$ to $SiH_4$ and $N_2O$ has a reduced fixed charge density in the film and is therefore a preferred material for this purpose. Needless to say, the gate insulation film is not always limited to such a silicon oxide nitride film, and other insulation films containing silicon may be used in either a single-layered or a multi-layered structure (FIG. 8(C)).

A heat-resistant conductor layer is formed so as to form the gate electrode on the gate insulation film 609 as shown in FIG. 8(D). The heat-resistant conductor layer may have a single-layered structure or a laminate structure comprising two or more layers. It is advisable to form a laminate structure comprising a conductor layer (A) 610 comprising a conductive metal nitride film and a conductor layer (B) 611 comprising a metal film, by using such a heat-resistant conductive material. The conductor layer (B) 611 may be formed of an element selected from tantalum (Ta), titanium (Ti), molybdenum (Mo) and tungsten (W), alloys consisting of these elements as the principal components, or alloy films comprising these elements (typically, a Mo—W alloy film or a Mo—Ta alloy film). The conductor layer (A) 610 is formed of tantalum nitride (TaN), tungsten nitride (WN), titanium nitride (TiN) or molybdenum nitride (MoN).

The conductor layer (A) 610 may also use tungsten silicide, titanium silicide or molybdenum silicide. To lower the resistance, the conductor layer (B) 611 preferably has a low impurity concentration. As to the oxygen concentration, in particular, it is preferably 30 ppm or below. When the oxygen concentration is 30 ppm or below, a specific resistance value of not higher than 20 μΩcm can be achieved in the case of tungsten (W), for example.

The thickness of the conductor layer (A) 610 is 10 to 50 nm (preferably 20 to 30 nm) and the thickness of the conductor layer (B) 611 is 200 to 400 nm (preferably 250 to 350 nm). When W is used for the gate electrode, the conductor layer (A) 610 is formed by tungsten nitride (WN) to a thickness of 50 nm and the conductor layer (B) 611, to 250 nm, by sputtering that uses W as the target and introduces the argon (Ar) gas and the nitrogen ($N_2$) gas.

Alternatively, the W film can be formed by thermal CVD that uses tungsten hexafluoride ($WF_6$). In any case, the resistance must be lowered to use the conductor layer as the gate electrode, and resistivity of the W film is preferably not higher than 20 μΩcm. Low resistivity of the W film can be achieved when the crystal grain size is decreased, but when the contents of the impurity elements such as oxygen are great in W, crystallization is inhibited and the resistance becomes higher. Therefore, when sputtering is used, the W target used has a purity of 99.9999% and sufficient caution should be taken lest the impurities mix from the gaseous phase during the film formation. When the W film is formed in this way, resistivity of 9 to 20 μΩcm can be accomplished.

On the other hand, when the TaN film and the Ta film are used for the conductor layers (A) 610 and (B) 611, respectively, these films can be formed similarly by sputtering. The TaN film is formed by the sputtering process that uses Ta as the target, and a mixed gas of Ar and nitrogen as the sputtering gas. The Ta film is formed by the sputtering process that uses Ar as the sputtering gas. When a suitable amount of Xe or Kr is added into these sputtering gases, the element mitigates the internal stress of the resulting film and can prevent peel of the film.

Resistivity of the Ta film of the α phase is about 20 μΩcm and this film can be used for the gate electrode. However, resistivity of the Ta film of the β phase is about 180 μΩcm and the film is not suitable for the gate electrode. Since the TaN film has a crystal structure approximate to the α phase, the Ta film of the α phase can be easily obtained when the Ta film is formed on the TaN film. Incidentally, it is effective to form a silicon film doped with phosphorus (P) to a thickness of about 2 to about 20 nm below the conductor layer (A) 610, through it is not shown in the drawing. This film improves adhesion of the conductor film to be formed thereon and prevents oxidation. At the same time, the film can prevent the diffusion of the alkali metal elements contained in trace amounts in the conductor layer (A) 610 or in the conductor layer (B) 611 into the gate insulation film 609. In any case, resistivity of the conductor layer (B) 611 is preferably within the range of 10 to 50 μΩcm.

Next, resist masks 612 to 617 are formed by the photolithography technique that uses a photo-mask 2 (PM2). The conductor layer (A) 610 and the conductor layer (B) 611 are collectively etched so as to form the gate electrodes 618 to 622 and the capacitance lead wire 623. The gate electrodes 618 to 622 and the capacitance lead wire 623 have a unitary structure of 618a to 623a comprising the conductor layer (A) and 618b to 623b comprising the conductor layer (B) (FIG. 9(A)).

The etching method of these conductor layers (A) and (B) may be selected appropriately by the operator. When they are made of the material consisting of W as the principal component as described above, however, dry etching using a high density plasma is preferably employed to conduct etching at a high etching rate and with high accuracy.

An inductively coupled plasma (ICP) apparatus is preferably used as one of the means for obtaining high-density plasma. The etching method of W using the ICP etching apparatus is executed in the following way. Two kinds of gases, i.e. $CF_4$ and $Cl_2$, are introduced as the etching gases into the reaction chamber and the pressure is set to 0.5 to 1.5 Pa (preferably to 1 Pa). High-frequency (13.56 MHz) power of 200 to 1,000 W is applied to the inductively coupled portion. At this time, 20 W high frequency power is applied to the stage on which the substrate is placed, and the substrate is charged to the negative potential due to self bias. In consequence, the positive ions are accelerated and anisotropic etching can be carried out. When the ICP etching apparatus is employed, a hard metal film such as W can be etched at an etching rate of 2 to 5 nm/sec.

To conduct etching without leaving the residue, the etching time is increased at a proportion of about 10 to about 20% to thereby execute over-etching. In this case, however, a selection ratio with respect to etching of the underlying layers must be taken into consideration. For example, the selection ratio of the silicon oxide nitride film (gate insulation film 609) with respect to the W film is 2.5 to 3. Therefore, such over-etching etches the exposed surface of the silicon nitride oxide film by about 20 to about 50 nm, and this film becomes substantially thinner.

To form the LDD region in the n channel TFT, the step of adding the n imparting impurity element (n⁻ doping step) is conducted. Here, the n imparting impurity element is added by ion doping in self-alignment with the gate electrodes 618 to 622 as the mask. The concentration of phosphorus (P) added as the n imparting impurity element is within the range of $1\times10^{16}$ to $5\times10^{19}$ atoms/cm³. In this way, the low concentration n type impurity regions 624 to 629 are formed in the island-like semiconductor layers as shown in FIG. 9(B).

Next, high concentration n type impurity regions that function as the source region or the drain region in the n channel TFT are formed (n⁺ doping step). First, resist masks 630 to 634 are formed using a photo mask 3 (PM3) and the n imparting impurity element is added to form high concentration n type impurity regions 635 to 640. Phosphorus (P) is used as the n imparting impurity element. Ion doping is conducted using phosphine (PH₃) so that the P concentration is within the range of $1\times10^{20}$ to $1\times10^{21}$ atoms/cm³ (FIG. 9(C)).

High concentration p impurity regions 644 and 645 to serve as the source region and the drain region are then formed in the island-like semiconductor layers 604 and 606 that constitute the p channel TFT. Here, a p imparting impurity element is added with the gate electrodes 618 and 620 as the mask, and the high concentration p type impurity regions are formed in self-alignment. At this time, the entire surface of the island-like semiconductor films 605, 607 and 608 for forming the n channel TFT is covered with resist masks 641 to 643 using a photo-mask 4 (PM4).

The high concentration p impurity regions 644 and 645 are formed by the ion doping method that uses diborane (B₂H₆). The boron (B) concentration in these regions is $3\times10^{20}$ to $3\times10^{21}$ atoms/cm³ (FIG. 9(D)). Phosphorus (P) is added to the high concentration p type impurity regions 644*a* and 645*a* in the pre-step. The high concentration p type impurity regions 644*a* and 645*a* have a concentration of $1\times10^{20}$ to $1\times10^{21}$ atoms/cm³ and the high concentration p type impurity regions 644*b* and 645*b* have a concentration of $1\times10^{16}$ to $5\times10^{19}$ atoms/cm³. As the concentration of boron (B) added in this step is set to 1.5 to 3 times, there occurs no problem when these high concentration p type impurity regions function as the source region and the drain region of the p channel TFT.

Thereafter, a protective insulation film 646 is formed from above the gate electrode and the gate insulation film as shown in FIG. 10(A). The protective insulation film may be a silicon oxide film, a silicon oxide nitride film, a silicon nitride film or their laminate film. In any case, the protective insulation film 646 is made of an inorganic insulating material. The film thickness of this protective insulation film 646 is 100 to 200 nm.

When the silicon oxide film is used, the film is formed by the plasma CVD process by mixing tetraethyl orthosilicate (TEOS) and O₂ and generating discharge at a reaction pressure of 40 Pa, a substrate temperature of 300 to 400° C. and a high frequency (13.56 MHz) power density of 0.5 to 0.8 W/cm². When the silicon oxide nitride film is used, the film may be a silicon oxide nitride film formed by the plasma CVD process from SiH₄, N₂O and NH₃ or a silicon oxide nitride film from SiH₄ and N₂O.

The film formation condition in this case is a reaction pressure of 20 to 200 Pa, a substrate temperature of 300 to 400° C. and a high frequency (60 MHz) power density of 0.1 to 1.0 W/cm². A hydrogenated silicon oxide nitride film prepared from SiH₄, N₂O and H₂ may be also used. The silicon nitride film can also be prepared from SiH₄ and NH₃ by the plasma CVD process.

Next, an activation step of activating the n or p imparting impurity elements added in the respective concentrations is carried out. This step is conducted by the thermal annealing method that uses a furnace annealing oven. It is also possible to employ the laser annealing method or the rapid thermal annealing method (RTA method). The thermal annealing method is carried out in a nitrogen atmosphere having an oxygen concentration of 1 ppm or below, preferably 0.1 ppm or below, at 400 to 700° C., typically at 500 to 600° C. In this embodiment, the heat treatment is conducted at 550° C. for 4 hours. When the plastic substrate having low heat-resistance is used for the substrate 601, the laser annealing method is preferably employed (FIG. 10(B)).

After this activation step, heat treatment is further carried out in an atmosphere containing 3 to 100% hydrogen at 300 to 450° C. for 1 to 12 hours so as to hydrogenate the island-like semiconductor film. This is the process step that terminates the dangling bonds of $10^{16}$ to $10^{18}$/cm³ in the island-like semiconductor film by hydrogen that is thermally excited. Plasma hydrogenation (using hydrogen that is excited by plasma) may be employed as other hydrogenation means.

After the activation and hydrogenation steps are completed, an inter-layer insulation film 647 made of an organic insulating material is formed to a mean film thickness of 1.0 to 2.0 μm. Examples of the organic resin materials are polyimide, acryl, polyamide, polyimidamide and BCB (benzocyclobutene). When the polyimide of the type that is thermally polymerized after being applied to the substrate is used, for example, the inter-layer insulation film is formed by baking the resin material at 300° C. inside a clean oven. When the acrylic resin is used, a two-liquid type is used. Namely, after a main agent and curing agent are mixed, the resin is applied to the entire surface of the substrate by a spinner, followed by preparatory heating at 80° C. for 60 seconds by a hot plate and then by baking at 250° C. for 60 minutes inside a clean oven.

Since the inter-layer insulation film is formed of the organic insulating material as described above, the surface can be planarized satisfactorily. The organic resin materials in general have a low dielectric constant and can reduce the parasitic capacitance. However, since they are hygroscopic, they are not suitable for the protective film. Therefore, the organic resin material as the inter-layer insulation film must be used in combination with the silicon oxide film or the silicon oxide nitride film or the silicon nitride film formed as the protective insulation film 646 as in this embodiment.

A resist mask having a predetermined pattern is formed thereafter by using a photo-mask, 5 (PM5). Contact holes reaching the source or drain region formed in each island-like semiconductor film are then formed. Dry etching is used to form the contact holes. In this case, dry etching uses a mixed gas of CF₄, O₂ and He. The inter-layer insulation film made of the organic resin material is first etched. Next, the etching gas is switched to a mixed gas of CF₄ and O₂, and the protective insulation film 646 is etched. Furthermore, to improve the selection ratio with respect to the island-like semiconductor film, the etching gas is switched to CHF₃ and the gate insulation film is etched. In this way, the contact holes can be formed satisfactorily.

A conductive metal film is formed by sputtering or vacuum deposition, and a resist mask pattern is formed by using a photo-mask 6 (PM6). Etching is conducted subsequently to form source lead wires 648 to 652 and drain lead wires 653 to 657. Here, the drain lead wire 657 functions as the pixel electrode. This electrode comprises a Ti film formed to a thickness of 50 to 150 nm, though not shown in the drawing. Contact with the semiconductor film forming the source or drain region of the island-like semiconductor film is established, and aluminum (Al) is formed to a thickness of 300 to 400 nm in superposition with, and on, the Ti film, giving the lead wire.

When hydrogenation is conducted under this state, favorable results can be obtained for improving the characteristics of the TFT. For example, heat treatment is carried out preferably in an atmosphere containing 3 to 100% hydrogen at 300 to 450° C. for 1 to 12 hours. Similar effects can also be obtained by using the plasma hydrogenation method. Such a heat treatment diffuses hydrogen existing in the protective insulation film 646 and in the underlying film 602 into the island-like semiconductor films 604 to 608 and hydrogenation can thus be achieved. In any case, the defect density in the island-like semiconductor films 604 to 608 is preferably lowered to $10^{16}/cm^3$ or below, and to attain this object, 0.01 to 0.1 atomic % of hydrogen may be added (FIG. 10(C)).

In this way, the substrate having the TFT of the driving circuit and the pixel TFT of the pixel portion on the same substrate can be completed by the use of six photo-masks in total. The first p channel TFT 700, the first n channel TFT 701, the second p channel TFT 702 and the second n channel TFT 703 are formed in the driving circuit. The pixel TFT 704 and the holding capacitance 705 are formed in the pixel portion. The present specification calls such a substrate "active matrix substrate" for convenience sake.

The first p channel TFT 700 of the driving circuit has a single drain structure that includes the source regions 707*a* and 707*b* and the drain regions 708*a* and 708*b* comprising the channel formation region 706 and the high concentration impurity region in the island-like semiconductor film 604. The first n channel TFT 701 includes the channel formation region 709, the LDD region 710 not overlapping with the gate electrode 619, the source region 712 and the drain region 711 in the island-like semiconductor film 605. The length of this LDD region in the direction of the channel length is 1.0 to 4.0 μm, preferably 2.0 to 3.0 μm. As the length of the LDD region in the n channel TFT is set to this length, the high electric field developing in the proximity of the drain region can be mitigated and the occurrence of hot carriers, hence degradation of the TFT, can be prevented.

The second p channel TFT 702 of the driving circuit has similarly the channel formation region 713 and the single drain structure having the source regions 714*a* and 714*b* and the drain regions 715*a* and 715*b* comprising the high concentration p impurity region in the island-like semiconductor film 606. The second n channel TFT 703 has the channel formation region 716, the LDD regions 717 and 718, the source region 720 and the drain region 719 that are formed in the island-like semiconductor film 607. The length of the LDD of this TFT, too, is 1.0 to 4.0 μm. The pixel TFT 704 includes the channel formation regions 721 and 722, the LDD regions 723 to 725 and the source or drain regions 726 to 728 in the island-like semiconductor film 608. The length of the LDD region in the direction of the channel length is 0.5 to 4.0 μm, preferably 1.5 to 2.5 μm.

The holding capacitance 705 comprises the capacitance lead wire 623, the insulation film made of the same material as that of the gate insulation film and the semiconductor layer 729 connected to the drain region 728 of the pixel TFT 704. In FIG. 10(C), the pixel TFT 704 is shown as having the double-gate structure, but the single gate structure or a multi-gate structure including a plurality of gate electrodes may be used, as well.

Next, ZnO is sputtered to a thickness of 100 nm to form the pixel light-transmitting electrode 670, and is etched to obtain a predetermined electrode. Since no sensor is provided on the active matrix substrate in this embodiment, a window for the sensor need not be disposed. Therefore, the pixel electrode comprises the reflecting electrode and the light-transmitting electrode. The pixel electrode pattern is designed so that when the active matrix substrate is bonded later to the opposed substrate to form the display panel, the arrangement becomes planar and the sensor can be disposed in such a manner as to correspond to each pixel.

The opposed substrate uses glass as the same material as that of the active matrix substrate. The sensor portion is formed in the arrangement designed in advance by the same production method as that of Embodiment 1. The production process of the afore-mentioned poly-silicon TFT may be applied to the circuit for driving this sensor, so as to form this driving circuit on the same substrate as the sensor. It is also possible to form only the matrix lead wires and the sensor device, and to use the IC to be mounted from outside for the driving circuit. From the aspect of portability that is one of the objects of the present invention, however, the driving circuit is preferably assembled on the substrate to accomplish more easily the smaller capacity. In this embodiment, the driving circuit and the sensor are provided on the same substrate (FIG. 11(B) 503).

Color filters 502 made of an acrylic resin are formed in RGB at another surface of the substrate, wherein the positions designed in advance by using a known technology. The color filters can be disposed on the sensor portion 503, too.

Figure 11B:
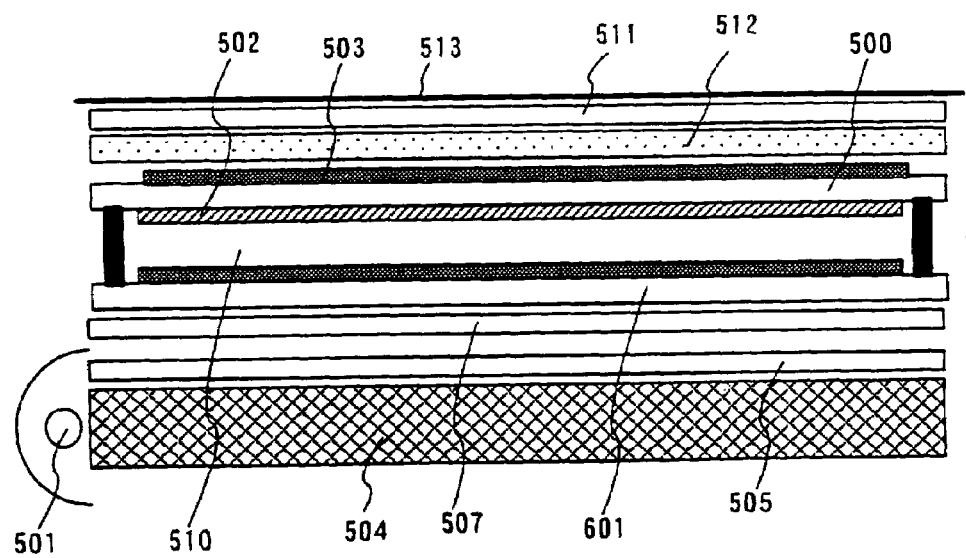

The opposed electrode 500 thus formed is put on the active matrix substrate 601 and the integral image recognition/display device shown in FIG. 11(B) can be accomplished. In comparison with Embodiment 1, the distance between the document and the sensor portion is smaller in this Embodiment 2, and this embodiment is therefore advantageous in that the information read error (so-called "fuzz") becomes smaller. A sheet 512 that provides the optical effect can be interposed between the polarizing plate 511 and the opposed substrate. When an optical fiber plate is disposed as the sheet, a greater quantity of light can be utilized. When a lens array sheet is disposed, the rays of light from the document can be image-formed on the sensor, and the read error can be further reduced.

In this embodiment, the color filters and the sensor portion are disposed on the opposed electrode. In the case of so-called "monochromatic display", however, the color filters become unnecessary. The disposition of the sensor at the position closer to the document provides the same effect as in this embodiment.

The apparatus of this embodiment has the features in that the display apparatus can be used selectively in the reflection mode and the transmission mode depending on the place of use, and the document can be read by the rays of light from the backlight 501 passing through the light-transmitting electrodes of the pixel electrodes at the time of the image recognition while power consumption is restricted. Therefore, the capacity of the PDA (portable personal terminal) incorporating the image recognition/display apparatus can be restricted to an extremely small capacity, and the read function of the name card and the photo or the read function of digital camera can be accomplished.

Embodiment 3

Figure 12:
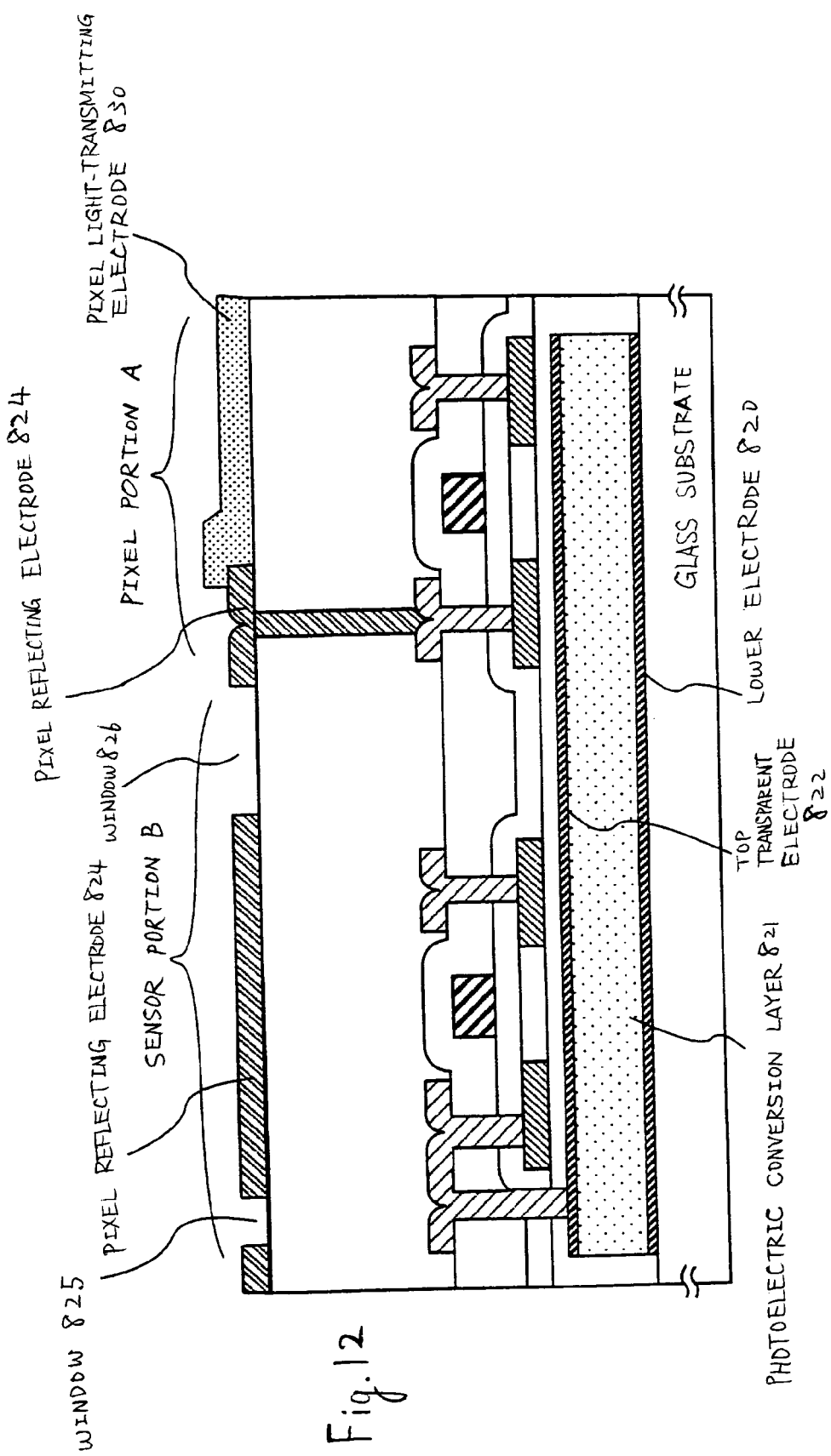
FIG. 12 is a sectional view showing an active matrix substrate of the integral image recognition/display apparatus according to a certain embodiment of the present invention.

This embodiment is accomplished when the active matrix substrate shown in FIG. 12 is used as the substrate of the apparatus of the present invention shown in FIG. 11(A). The positional relationship of the sensor device and the switching active device with respect to the substrate is reversed. This TFT device employs the TOP gate structure.

In Embodiment 1, the shading layers 404 and 405 are disposed below the TFT device whenever necessary, but in this embodiment, the sensor device itself functions also as the shading layer. Accordingly, the process steps can be reduced, and the erroneous operation (cross-talk) of the TFT device due to backlight necessary for the display in the transmission mode can be prevented.

In this embodiment, all the sensor devices are extended in such a fashion as to function as the shading layer of the TFT device. However, similar effects can be obtained when at least a part of the sensor devices is extended and has the function of preventing the cross-talk of the TFT device.

The semiconductor device applicable to this embodiment can be produced in accordance with the process steps described in Embodiment 1 or 2.

Embodiment 4

Figure 13:
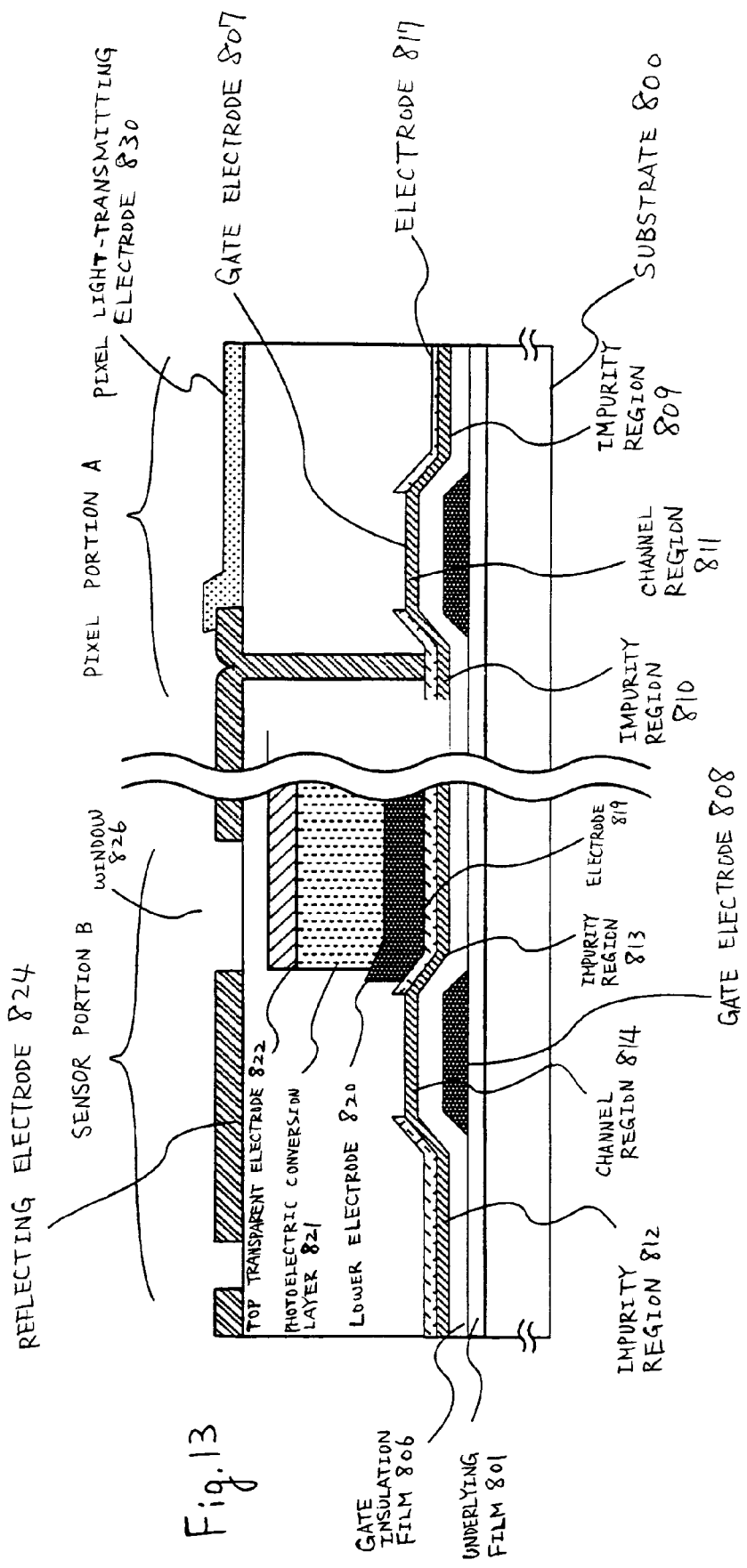
FIG. 13 is a sectional view of the active matrix substrate of the integral image recognition/display apparatus according to a certain embodiment of the present invention.

This embodiment can be accomplished when the active matrix substrate shown in FIG. 13 is used as the substrate of the integral image recognition/display apparatus shown in FIG. 11(A). The sensor device and the switching active device structure are different from those of Embodiment 1, and bottom-gate type TFT is used.

Although in Embodiment 1, shading layers 404 and 405 are formed under the TFT device as occasion demands, in this Embodiment 4, the gate electrode 808 of the TFT device serves as a shading layer, too. Thereby, the step of exclusively providing a shading layer can be shortened, and malfunction (cross-talk) of the TFT device by a backlight which is necessary for a transmission-mode display can be prevented.

Embodiment 5

Figure 14:
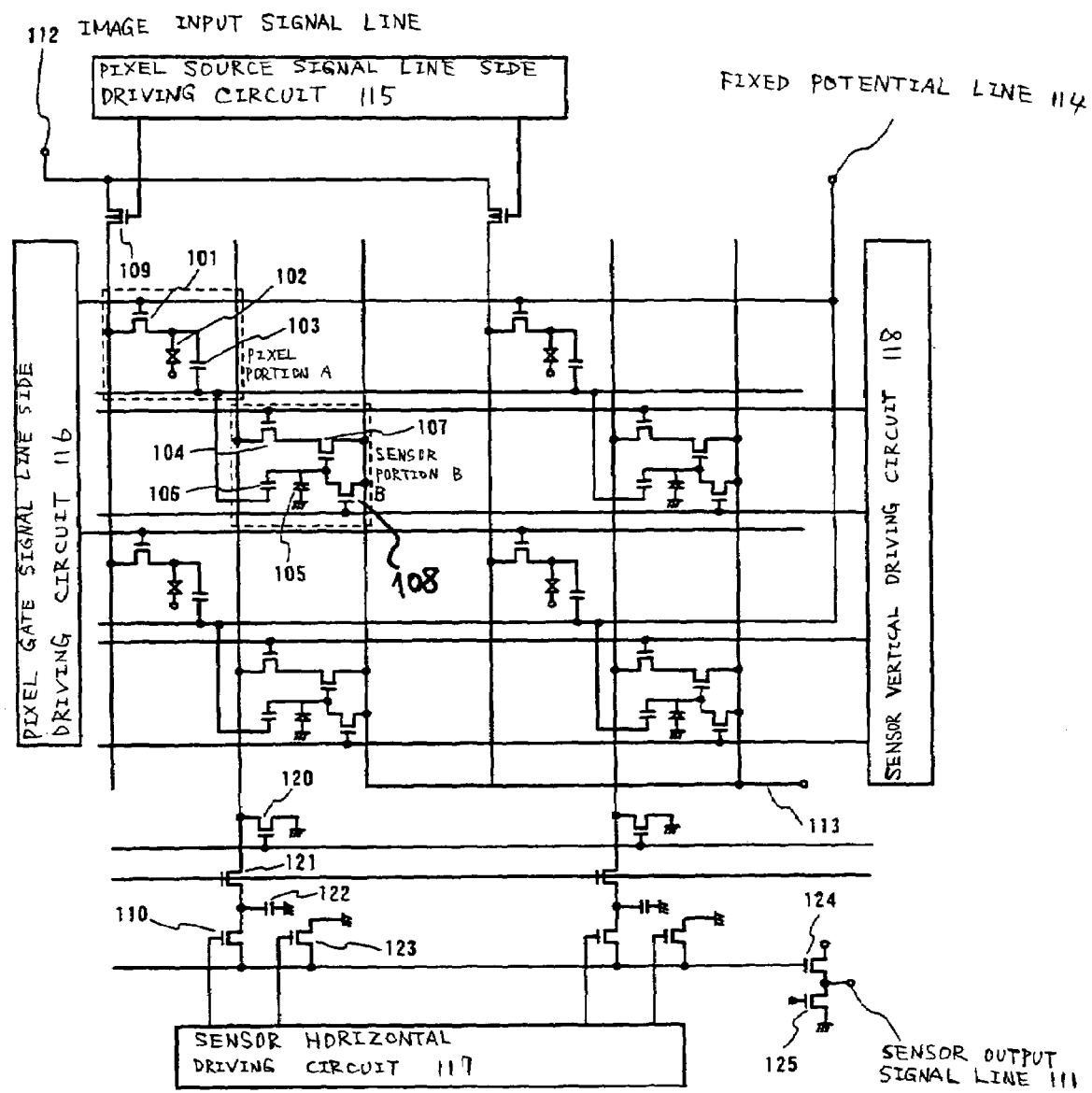
FIG. 14 is a circuit diagram of the integral image recognition/display apparatus according to a certain embodiment of the present invention.

This embodiment will be explained with reference to FIG. 14. The drawing shows an example of the circuit construction that can be adapted to the integral image recognition/display apparatus of the present invention. Though FIG. 14 shows the circuit construction having 2×2 (vertical×horizontal) pixels for the sake of explanation, a greater number of pixels are formed on an actual substrate. In the case of the display device of the VGA standard, for example, the number of pixels is 640×480, and the display device of the SVGA standard has 800×600 pixels. The peripheral driving circuit is simply represented by blocks.

Reference numeral 101 denotes pixel TFT and reference numeral 102 denotes a liquid crystal. Reference numeral 103 denotes an auxiliary capacitance and reference numeral denotes a sensor TFT. Reference numeral 105 denotes a photo diode PD and reference numeral 106 denotes an auxiliary capacitance. Reference numeral 107 denotes a signal amplification TFT and reference numeral 108 denotes a reset TFT. Reference numerals 109 and 110 denote analog switches. Reference numeral 120 denotes a bias TFT and reference numeral 121 denotes a transfer TFT. Reference numeral 122 denotes a sample-and-hold capacitance and reference numeral 123 denotes a discharge TFT. Reference numeral 124 denotes an amplification TFT for a final buffer and reference numeral 125 denotes a bias TFT for a final buffer. The circuit comprising these members 101 to 108 will be referred to as a "matrix circuit". The members 101 and 103 are the pixel portion A, and the members 104 to 108 are the sensor portion B. Reference numeral 111 denotes a sensor output signal line and reference numeral 112 denotes an image input signal line. Reference numerals 113 and 114 denote fixed potential lines and reference numeral 115 denotes a pixel source signal line side driving circuit. Reference numeral 116 denotes a pixel gate signal line side driving circuit and reference numeral 117 denotes a sensor horizontal driving circuit. Reference numeral 118 denotes a sensor vertical driving circuit.

When the image is displayed, the integral image recognition/display apparatus of the present invention supplies the image signals (gradation voltages) inputted from the image input signal line to the pixel TFT through the pixel source signal line side driving circuit 115 and through the pixel gate signal line side driving circuit 116, drives the liquid crystal sandwiched between the pixel electrodes connected to the pixel TFT and the opposed electrodes, and can thus display the image.

In comparison with FIG. 1, this FIG. 14 has the feature in that the auxiliary capacitance 103 provided to each pixel and the auxiliary capacitance 106 provided to the sensor are connected to the same fixed potential line 114. In other words, in the sectional view of FIG. 5, the upper transparent electrode 422 of the sensor and the reflecting electrode 425 of the pixel or its pixel light-transmitting electrode 424 overlap with each other, and the inter-layer insulation film 423 interposed between them comprises a dielectric. In this way, a capacitor can be accomplished positively at this portion. This is the auxiliary capacitance 103 and 106 shown in FIG. 14.

This construction makes it possible to reduce the capacitance area inside the substrate to the half. In other words, the auxiliary capacitance 103 necessary for displaying and the auxiliary capacitance 106 necessary for reading the image are not after all used simultaneously with each other. Therefore, they can be used in common as in this embodiment. In this way, effective utilization of the substrate and the reduction of the production steps can be accomplished.

FIG. 14 shows analog driving circuits handling the analog image signals for the pixel source signal line side driving circuit 115 and the pixel gate signal line side driving circuit 116, but they are not limitative. In other words, a digital driving circuit having mounted thereto a D/A conversion circuit for handling the digital image signals may be used, as well.

In the integral image recognition/display of the present invention, the photo diode PD 105 as the photoelectric conversion device reads the incident external image information (optical signals) and converts them to electric signals, and the sensor horizontal driving circuit 117 and the sensor vertical driving circuit 118 input the images. The image signals are inputted to other peripheral circuits (memory, CPU, etc) through the sensor output signal line 111. In addition to the auxiliary capacitance, the driving circuit for display can be used also as the driving circuit for image recognition.

The production method of the semiconductor device of this embodiment can be easily materialized with reference to Embodiment 1.

The production process of the semiconductor device of the present invention is the same as the production process of the conventional display device with the exception that the production process of the photoelectric conversion device is added. Since the conventional production process can be used, the semiconductor device of the present invention can be produced easily and economically. Even when the sensor function is mounted, the shape and the size of the substrate of the semiconductor device produced by the present invention do not change from those of the conventional panel. Therefore, the semiconductor device can be made small in size and light in weight.

The light reception area of the sensor cell is substantially equal to that of the pixel cell of the display cell and is greater than that of the single crystal CCD. Therefore, the sensor of the present invention has higher sensitivity. Furthermore, power consumed by the image sensor of the semiconductor device of the present invention is smaller than that of the CCD structure.

The display device is so constituted as to operate in both reflection mode and transmission mode. Therefore, power consumption of the overall apparatus can be restricted. In the portable terminal, in particular, the capacity can be reduced easily.

Particularly, the display device can be selectively used in the reflection mode and the transmission mode depending on the place of use, and power consumption can be restricted. The apparatus of the present invention can read the document by the rays of light from the backlight 501 transmitting through the light-transmitting electrode of the pixel electrode. Therefore, the PDA (portable personal terminal) assembled in the integral image recognition/display apparatus can be limited to the extremely small capacity, and the read function of the name card and the photo, or the read function of the digital camera, can be accomplished.

The invention claimed is:

1. A display device comprising:
   a plurality of pixel portions each comprising a transistor and arranged in matrix over a substrate;
   a plurality of sensor portions arranged in matrix over said substrate and comprising an upper electrode and a lower electrode and a photoelectric conversion layer provided between said upper electrode and said lower electrode;
   an insulation film provided over said upper electrode; and
   a pixel electrode provided over said insulation film and connected with one of a source region and a drain region of said transistor;
   wherein said pixel electrode overlaps with said upper electrode with said insulation film therebetween to provide a capacitance.

2. A display device according to claim 1, wherein a reflecting material and a light-transmitting material are used for a pixel electrode of each of said pixel portions.

3. A display device according to claim 1, wherein at least one of said TFT is a bottom gate type TFT or a top gate type TFT.

4. A display device according to claim 1, wherein said pixel electrode has an image display function.

5. A semiconductor device comprising:
   a pixel portion comprising a transistor provided over a substrate; and
   a sensor portion provided over said substrate and comprising an upper electrode and a lower electrode and a photoelectric conversion layer provided between said upper electrode and said lower electrode;
   an insulation film provided over said upper electrode; and
   a pixel electrode provided over said insulation film and connected with one of a source region and a drain region of said transistor;
   wherein said pixel electrode overlaps with said upper electrode with said insulation film therebetween to provide a capacitance.

6. A semiconductor device according to claim 5, wherein a reflecting material and a light-transmitting material are used for a pixel electrode of said pixel portion.

7. A semiconductor device according to claim 5, wherein said TFT is a bottom gate type TFT or a top gate type TFT.

8. A semiconductor device according to claim 5, wherein said pixel electrode has an image display function.

9. A display device comprising:
   a plurality of pixel portions each comprising an active device and arranged in matrix over a substrate;
   a plurality of sensor portions arranged in matrix over said substrate and comprising an upper electrode and a lower electrode and a photoelectric conversion layer provided between said upper electrode and said lower electrode;
   an insulation film provided over said upper electrode; and
   a pixel electrode provided over said insulation film and connected with one of a source region and a drain region of said transistor;
   wherein said pixel electrode overlaps with said upper electrode with said insulation film therebetween to provide a capacitance.

10. A display device according to claim 9, wherein a pixel electrode of each of said pixel portions comprises a reflecting material and a light-transmitting material.

11. A display device according to claim 9, wherein said pixel electrode has an image display function.

12. A semiconductor device comprising:
    a pixel portion comprising an active device provided over a substrate; and
    a sensor portion provided over said substrate and comprising an upper electrode and a lower electrode and a photoelectric conversion layer provided between said upper electrode and said lower electrode;
    an insulation film provided over said upper electrode; and
    a pixel electrode provided over said insulation film and connected with one of a source region and a drain region of said transistor;
    wherein said pixel electrode overlaps with said upper electrode with said insulation film therebetween to provide a capacitance.

13. A semiconductor device according to claim 12, wherein a pixel electrode of each of said pixel portions comprises a reflecting material and a light-transmitting material.

14. A semiconductor device according to claim 12, wherein said pixel electrode has an image display function.

* * * * *